US008194453B2

(12) United States Patent
Maejima

(10) Patent No.: US 8,194,453 B2
(45) Date of Patent: *Jun. 5, 2012

(54) THREE DIMENSIONAL STACKED NONVOLATILE SEMICONDUCTOR MEMORY

(75) Inventor: Hiroshi Maejima, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 555 days.

This patent is subject to a terminal disclaimer.

(21) Appl. No.: 12/422,601

(22) Filed: Apr. 13, 2009

(65) Prior Publication Data

US 2009/0267139 A1 Oct. 29, 2009

(30) Foreign Application Priority Data

Apr. 23, 2008 (JP) ................... 2008-112656

(51) Int. Cl.
*G11C 16/04* (2006.01)
(52) U.S. Cl. ......... 365/185.11; 365/185.05; 365/185.06; 257/324; 257/326
(58) Field of Classification Search .......... 365/51, 365/63, 185.11, 185.18, 185.05, 185.06; 257/314–316, 324, 326
See application file for complete search history.

(56) References Cited

U.S. PATENT DOCUMENTS

2009/0267128 A1* 10/2009 Maejima ............... 257/314

OTHER PUBLICATIONS

H. Tanaka, et al., "Bit Cost Scalable Technology with Punch and Plug Process for Ultra High Density Flash Memory", 2007 Symposium on VLSI Technology Digest of Technical Papers, 2007, pp. 14-15.

* cited by examiner

*Primary Examiner* — Richard Elms
*Assistant Examiner* — Hien Nguyen
(74) *Attorney, Agent, or Firm* — Oblon, Spivak, McClelland, Maier & Neustadt, L.L.P.

(57) ABSTRACT

A three dimensional stacked nonvolatile semiconductor memory according to examples of the present invention includes a memory cell array comprised of first and second blocks disposed side by side and a driver disposed between the first and second blocks. At least two conductive layers having the same structure as that of the at least two conductive layers in the first and second blocks are disposed on the driver, and select gate lines in the first and second blocks are connected to the driver through the at least two conductive layers on the driver.

20 Claims, 21 Drawing Sheets

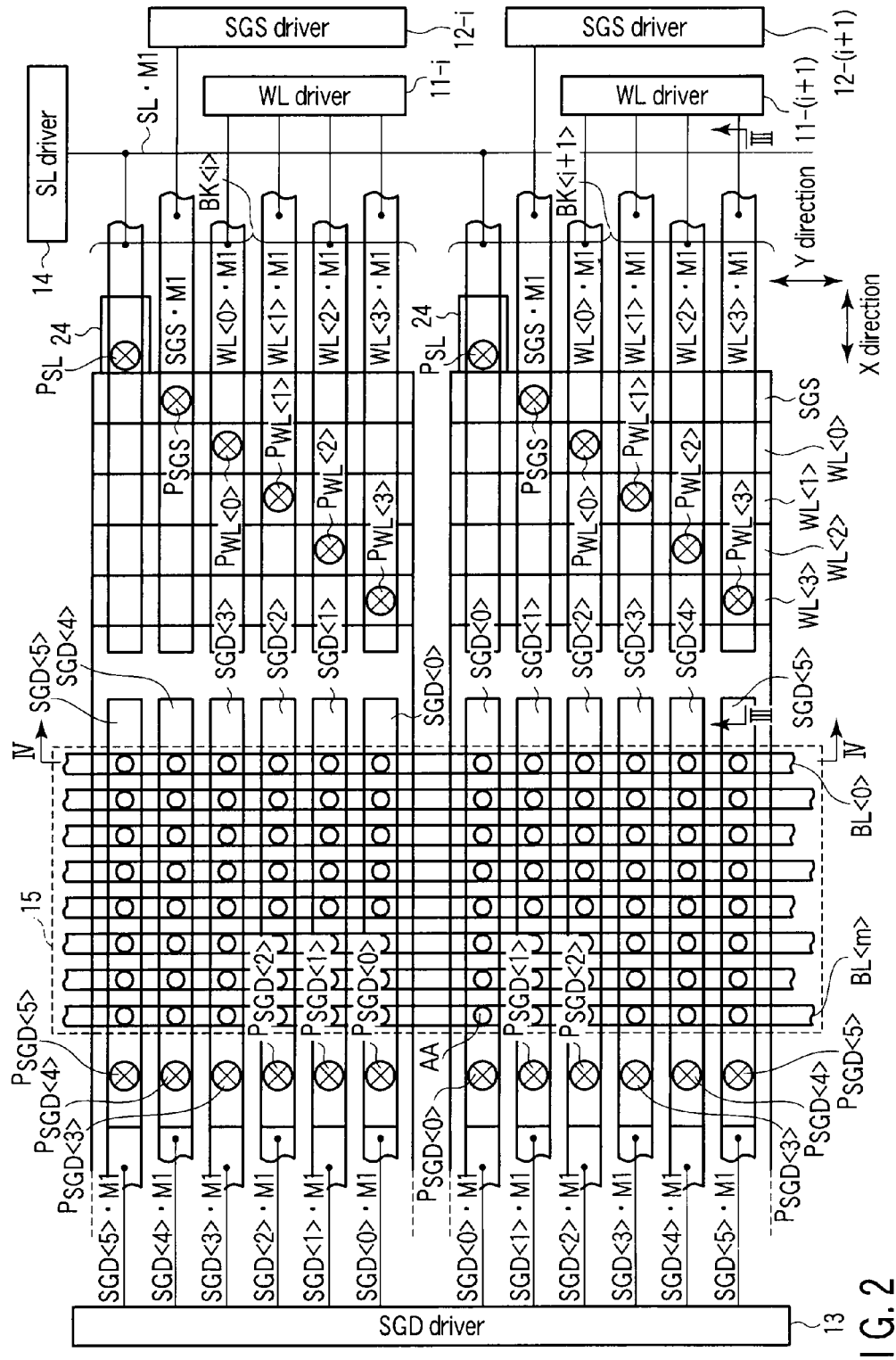
F I G. 2

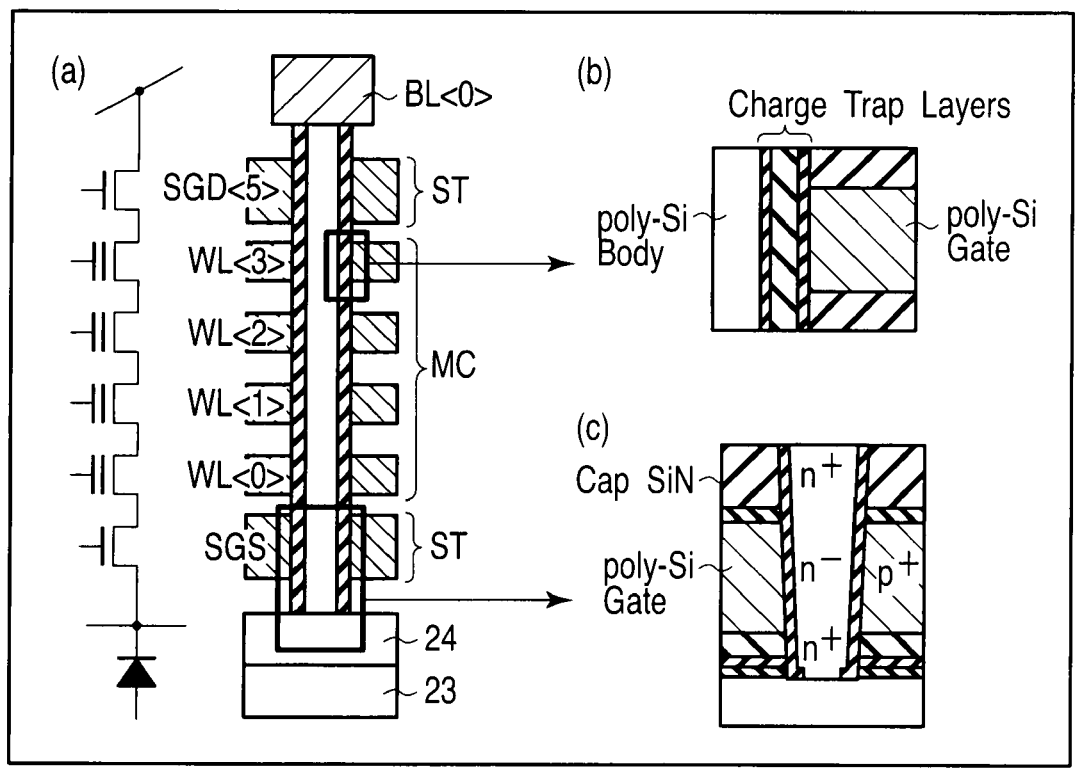
F I G. 5

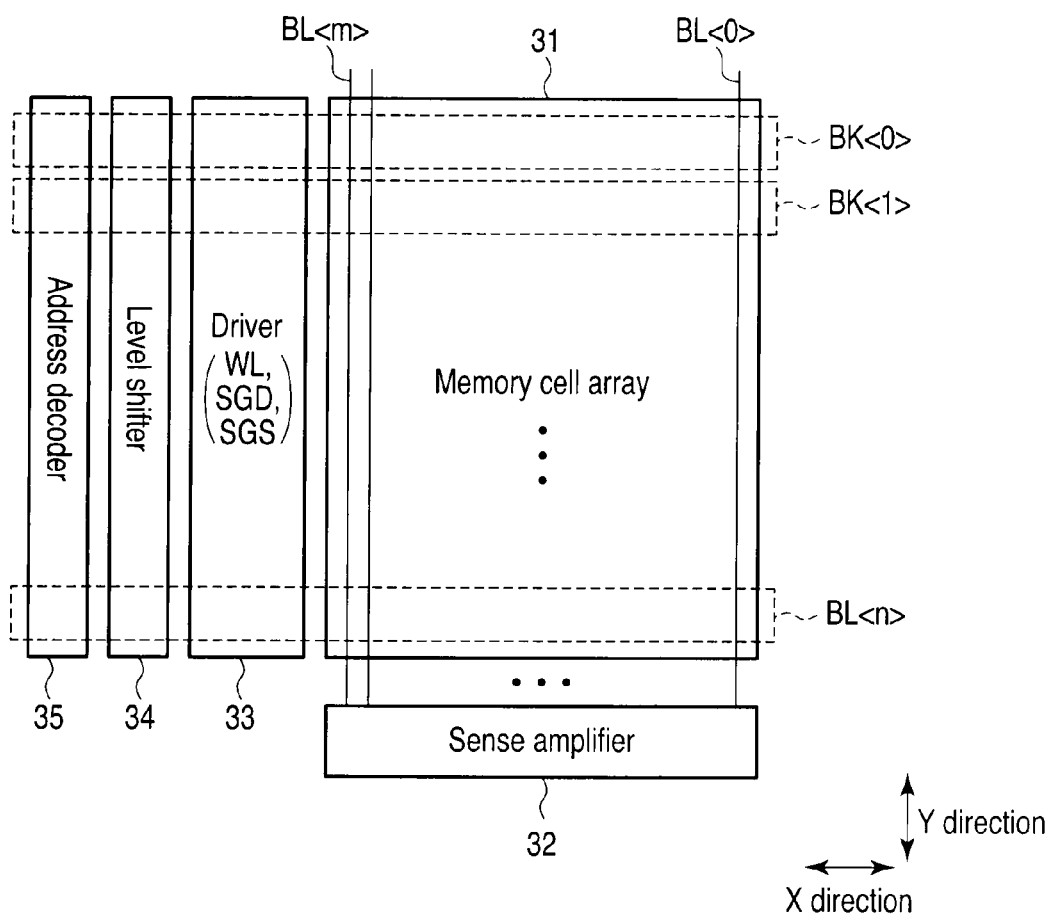
F I G. 10

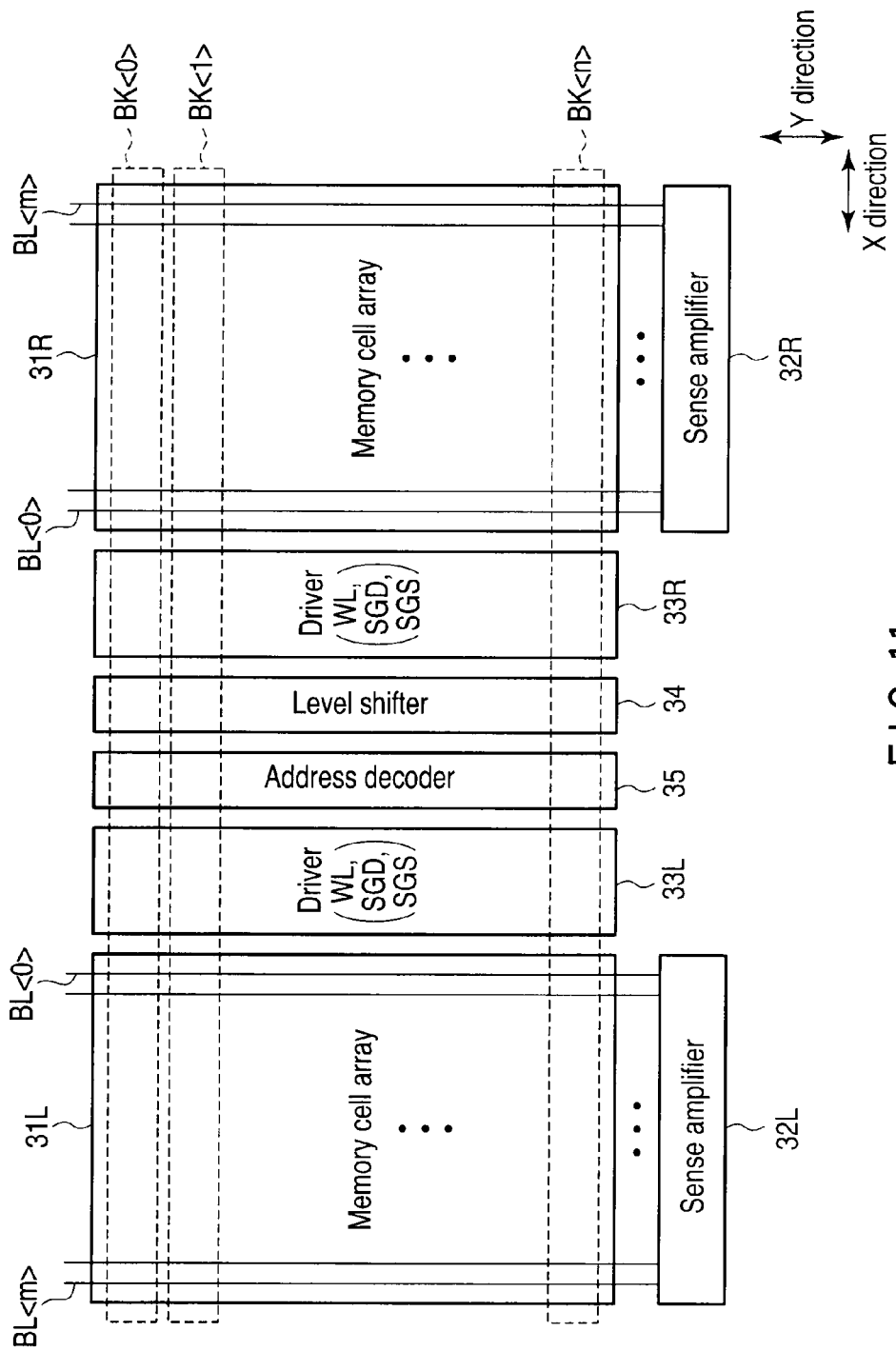
F I G. 11

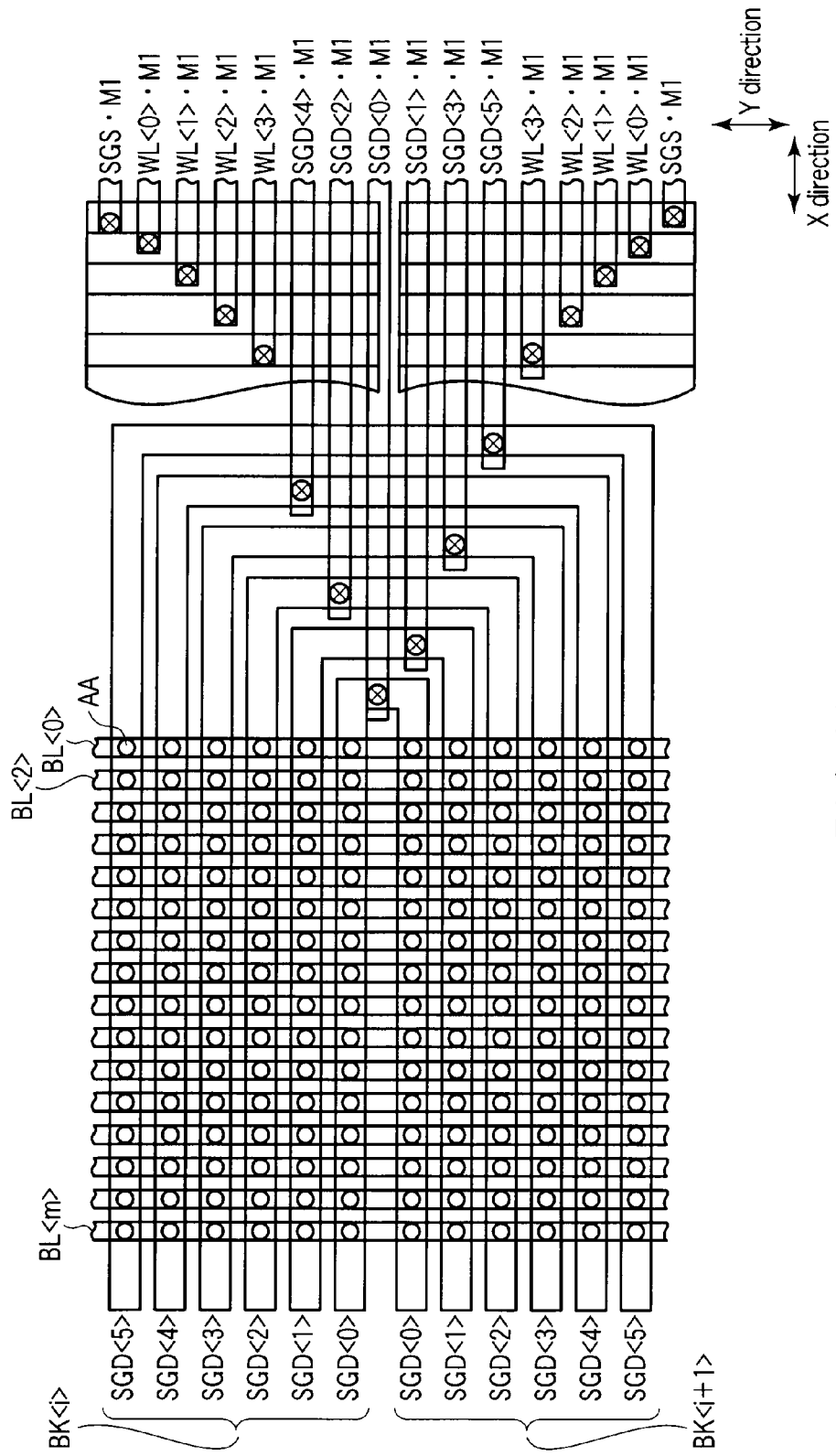
F I G. 14

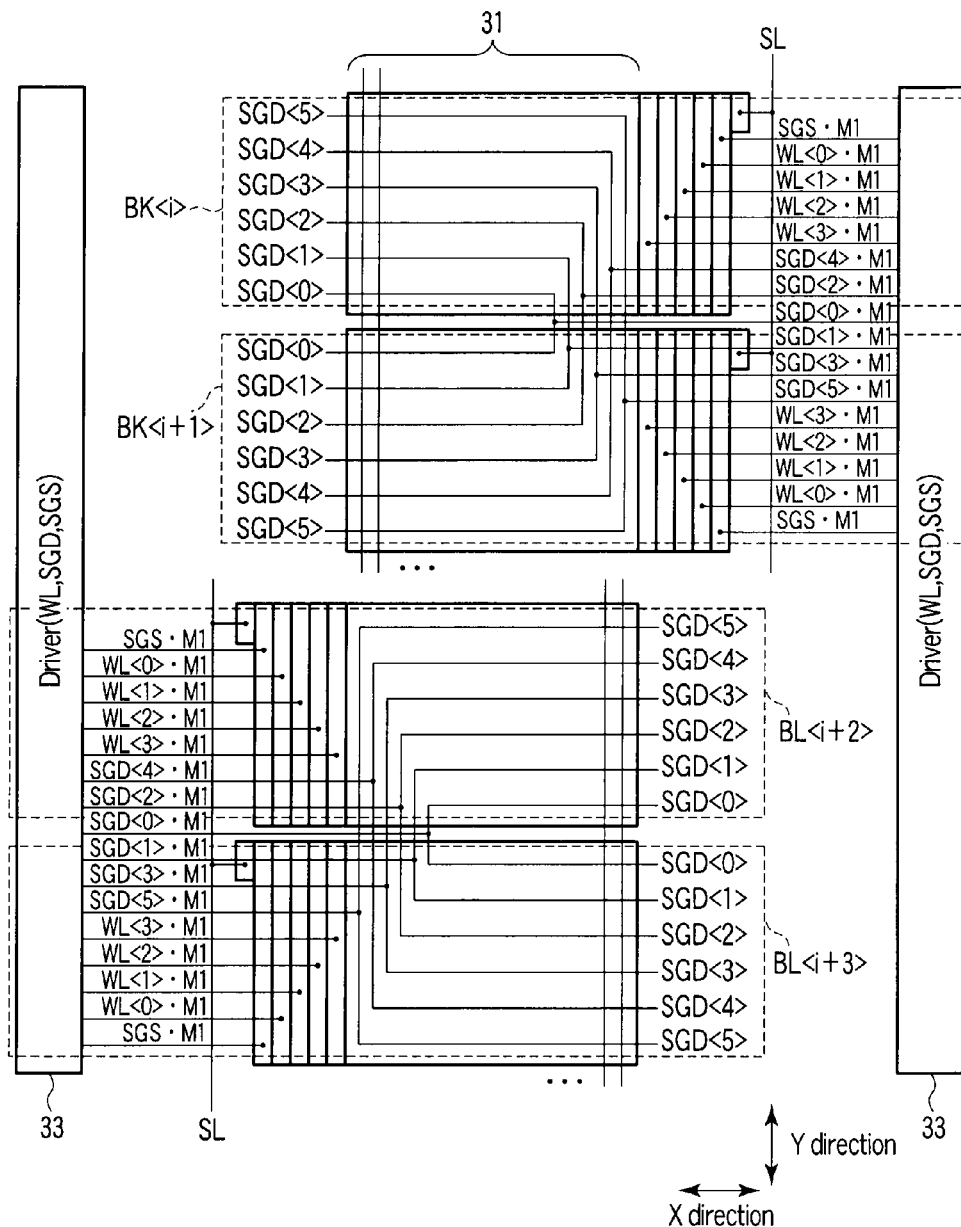
F I G. 15

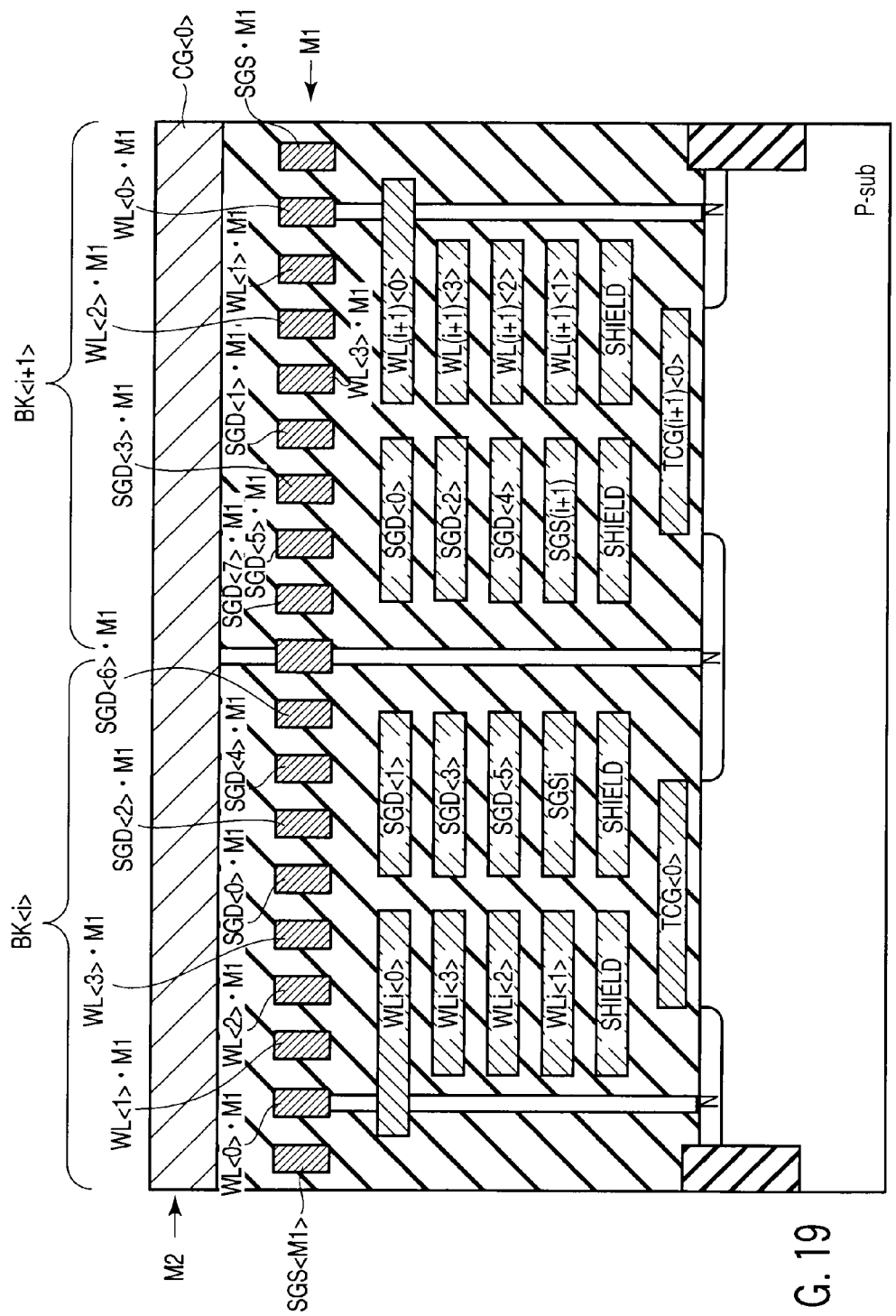
F I G. 19

THREE DIMENSIONAL STACKED NONVOLATILE SEMICONDUCTOR MEMORY

CROSS-REFERENCE TO RELATED APPLICATIONS

This application is based upon and claims the benefit of priority from prior Japanese Patent Application No. 2008-112656, filed Apr. 23, 2008, the entire contents of which are incorporated herein by reference.

BACKGROUND OF THE INVENTION

1. Field of the Invention

The present invention relates to a three dimensional stacked nonvolatile semiconductor memory.

2. Description of the Related Art

BiCS (Bit Cost Scalable) technology is known as a technology for suppressing a bit cost of a semiconductor memory by increasing the capacity thereof by a three dimensional structure (refer to, for example, "Bit Cost Scalable Technology with Punch and Plug Process for Ultra High Density Flash Memory" 2007 Symposium on VLSI Technology Digest of Technical Papers. p. 14).

A nonvolatile semiconductor memory to which the BiCS technology is applied (hereinafter, called a BiCS memory) has a feature in that it not only has a three dimensional structure but makes bit cost scalability possible so that a bit cost can be reduced in proportion to an increase of the number of stacked layers by devising a device structure and a process technology.

In, for example, a NAND flash memory to which the BiCS technology is applied (hereinafter, called a BiCS-NAND flash memory), a memory capacity, which greatly exceeds the limit of the memory capacity of a NAND flash memory having a two-dimensional structure, can be realized by increasing the number of cells in a longitudinal direction which comprise a NAND column by increasing the number of stacked layers.

However, since the BiCS memory which is represented by a BiCS-NAND flash memory has a unique device structure, there are many problems to be solved to practically use the BiCS memory.

One of the problems resides in that a wiring for connecting a memory cell to a driver is made complex.

In the BiCS memory, although a memory cell array is arranged as a three dimensional structure, a periphery circuit is arranged as a two dimensional structure likewise a conventional structure. Further, select gate lines on a bit line side must be disposed in one block according to a memory cell array structure specific to the BiCS memory.

Therefore, in the BiCS memory, the number of conductive wires is increased as many as the number of the select gate lines on the bit line side in one block as compared with a nonvolatile semiconductor memory having a two dimensional structure in which it is sufficient to dispose one select gate line on a bit line side in one block. As a result, a problem arises in that a wiring for connecting a memory cell to a driver is made complex.

BRIEF SUMMARY OF THE INVENTION

A three dimensional stacked nonvolatile semiconductor memory according to an aspect of the present invention comprises a semiconductor substrate, a memory cell array comprised of first and second blocks disposed on the semiconductor substrate side by side, and a driver disposed between the first and second blocks.

Each of the first and second blocks is comprised of at least two conductive layers stacked on the semiconductor substrate by being insulated from each other, a bit line disposed on the at least two conductive layers by being insulated therefrom, and a columnar semiconductor having a lower end connected to the semiconductor substrate and an upper end connected to the bit line and passing through the at least two conductive layers.

Each of the at least two conductive layers is comprised of one of a select gate line and a word line.

A select gate transistor is comprised of the select gate line and the columnar semiconductor, and a memory cell is comprised of the word line and the columnar semiconductor.

At least two conductive layers having the same structure as that of the at least two conductive layers in the first and second blocks are disposed on the driver, and the select gate lines in the first and second blocks are connected to the driver through the at least two conductive layers on the driver.

A three dimensional stacked nonvolatile semiconductor memory according to an aspect of the present invention comprises a semiconductor substrate, a memory cell array comprised of first and second blocks disposed on the semiconductor substrate side by side in a first direction, and a driver disposed between the first and second blocks.

Each of the first and second blocks is comprised of at least three conductive layers stacked on the semiconductor substrate by being insulated from each other, a bit line disposed on the at least three conductive layers by being insulated therefrom, and columnar semiconductors having lower ends connected to the semiconductor substrate and upper ends connected to the bit line and passing through the at least three conductive layers.

The uppermost layer of the at least three conductive layers is comprised of first select gate lines extending in the second direction, the lowermost layer of the at least three conductive layers is a second select gate line, the remaining conductive layers excluding the uppermost layer and the lowermost layer of the at least three conductive layers are a word line, and the remaining conductive layers excluding the uppermost layer of the at least three conductive layers have a plate shape whose width in the first direction is larger than the width in the first direction of the first select gate lines.

Select gate transistors are comprised of the first select gate lines and the columnar semiconductors, and the second select gate line and the columnar semiconductors, respectively and memory cells are comprised of the word line and the columnar semiconductors, respectively.

At least three conductive layers having the same structure as that of the at least three conductive layers in the first and second blocks are disposed on the driver, and first select gate lines in the first and second blocks are connected to the driver through the at least three conductive layers on the driver.

BRIEF DESCRIPTION OF THE SEVERAL VIEWS OF THE DRAWING

FIG. 2 is a plan view of the BiCS-NAND flash memory;
FIG. 5 is a structure view of a NAND cell unit.

FIG. 10 is a view showing a second example of the block layout;

FIG. 11 is a view showing a third example of the block layout;

FIG. 14 is a plan view when the select gate lines shown in FIG. 13 are arranged as a device;

FIG. 15 is a view showing a layout of select gate lines on a bit line side;

FIG. 19 is a sectional view taken along line XIX-XIX of FIG. 18;

DETAILED DESCRIPTION OF THE INVENTION

A three dimensional stacked nonvolatile semiconductor memory of an aspect of the present invention will be described below in detail with reference to the accompanying drawing.

1. Outline

Examples of the present invention propose a structure in which at least two conductive layers, which have the same structure as that of at least two conductive layers in a memory cell array, are disposed on a driver and select gate lines on a bit line side in the memory cell array is connected to the driver through the at least two conductive layers to suppress that a wiring is made complex due to a structure specific to a BiCS memory, that is, due to select gate lines on a bit line side disposed in one block.

With this arrangement, the wiring for connecting a memory cell to a driver of a three dimensional stacked nonvolatile semiconductor memory, to which the BiCS technology is applied, can be suppressed from being made complex.

Incidentally, there is a technology for sharing select gate lines on a bit line side by two blocks, i.e., a technology for connecting select gate lines on a bit line side to a driver after the select gate lines on the bit line side in one of the blocks are commonly connected to the select gate lines on the bit line side in the other of the blocks in the relation of one to one. According to the technology, although the area of the driver can be decreased as well as a wiring can be suppressed from being made complex, a problem of the complexity of the wiring cannot be still sufficiently solved by it when compared with a nonvolatile semiconductor memory having a two dimensional structure.

The examples of the present invention can exhibit a maximum advantage for suppressing the complexity of the wiring by the synergic effect of a decrease of the area of a driver (a decrease of the number of transistors) and an increase of the number of conductive layers by combining in particular the technology for sharing select gate lines on a bit line side.

2. BiCS Memory (1) Basic Structure

First, a basic structure of a BiCS memory will be explained.

Figure 1:
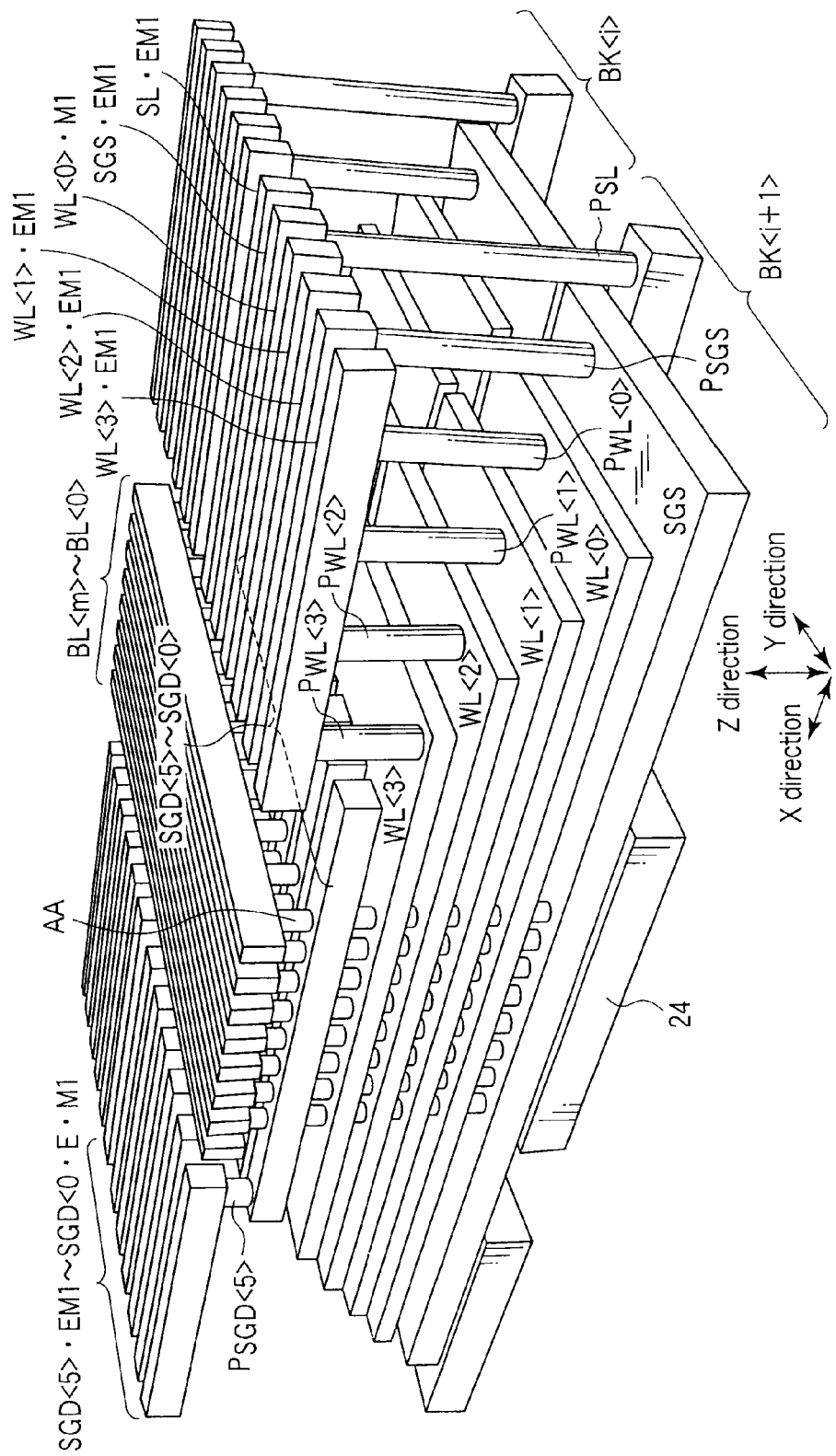
FIG. 1 is a bird's eye view of a BiCS-NAND flash memory.

FIG. 1 shows a bird's eye view of a BiCS-NAND flash memory.

The NAND flash memory is comprised of blocks each of which acts, for example, as a unit to be erased. Here, two blocks BK<i>, BK<i+1> are shown in the figure.

A source diffusion layer 24 formed in a semiconductor substrate is shared by, for example, all the blocks. The source diffusion layer 24 is connected to a source line SL·M1 through a contact plug $P_{SL}$. Further, at least three conductive layers (in the example, six-layer structure) comprised of, for example, conductive polysilicon are laminated on the source diffusion layer 24.

The remaining five conductive layers excluding the uppermost layer are formed in a plate shape, respectively in the one block BK<i+1> as well as the ends thereof in the X-direction are formed stepwise so that they are in contact with the respective conductive layers. A lowermost layer acts as a select gate line SGS on the source line side, and the remaining four conductive layers excluding the lowermost and uppermost layers act as word lines WL<0>, WL<1>, WL<2>, and WL<3>.

The uppermost layer is comprised of line-shaped conductive wires extending in the X-direction. Six conductive wires, for example, are disposed in the one block BK<i+1>. The six conductive wires, for example, of the uppermost layer act as select gate lines SGD<0>, . . . , SGD<5> on a bit line side.

Active layers (active areas) AA for comprising a NAND cell unit are formed columnarly in a Z-direction (direction vertical to the front surface of the semiconductor substrate) so that they reach the source diffusion layer 24 passing through the conductive layers.

The upper ends of the active layers AA are connected to bit lines BL<0>, . . . , BL<m> extending in a Y-direction. Further, the select gate line SGS on the source line side is connected to an interconnect line SGS·M1 extending in the X-direction through a contact plug $P_{SGS}$, and the word lines WL<0>, WL<1>, WL<2>, and WL<3> are connected to interconnect lines WL<0>·M1, WL<1>·M1, WL<2>·M1, and WL<3>·M1 extending in the X-direction through contact plugs $P_{WL<0>}$, $P_{WL<1>}$, $P_{WL<2>}$, $P_{WL<3>}$, respectively.

Further, select gate lines SGD<0>, . . . , SGD<5> on the bit line side are connected to interconnect lines SGD<0>·M1, . . . , SGD<5>·M1 extending in the X-direction through contact plugs $P_{SGD<0>}$, . . . , $P_{SGD<5>}$, respectively.

The bit lines BL<0>, . . . , BL<m> and the interconnect lines SGS·M1, WL<0>·M, WL<1>·M1, WL<2>·M1, and WL<3>·M1, SGD<0>·M1, . . . , SGD<5>·M1 are comprised of, for example, metal.

FIG. 2 shows a plan view of the BiCS-NAND flash memory of FIG. 1.

The columnar active layers AA are disposed in an array-state when viewed from the upper surface of the semiconductor substrate and comprise a memory cell array 15. Although the NAND cell unit is formed in each of the active layers AA, it will be described later in detail.

WL drivers 11-$i$ and 11($i$+1) are connected to the word lines WL<0>, WL<1>, WL<2>, and WL<3> through the interconnect lines WL<0>·M1, WL<1>·M1, WL<2>·M1, WL<3>·M1 and drive them in write, in read, and in erase.

SGS drivers 12-$i$ and 12-($i$+1) are connected to the select gate line SGS on the source line side through the interconnect line SGS·M1. A SGD driver 13 is connected to the select gate lines SGD<0>, ..., SGD<5> on the bit line side through the interconnect lines SGD<0>·M1, ..., SGD<5>·M1.

An SL driver 14 is connected to the source diffusion layer 24 through the source line SL·M1.

In this layout, the WL drivers 11-*i* and 11-(*i*+1) and the SGS drivers 12-*i* and 12-(*i*+1) are disposed on one end side of the memory cell array 15 in the X-direction, and the SGD driver 13 is disposed on the other end side of the memory cell array 15 in the X-direction in consideration of an increase of the number of transistors comprising the drivers as a peripheral circuit.

Figure 3:
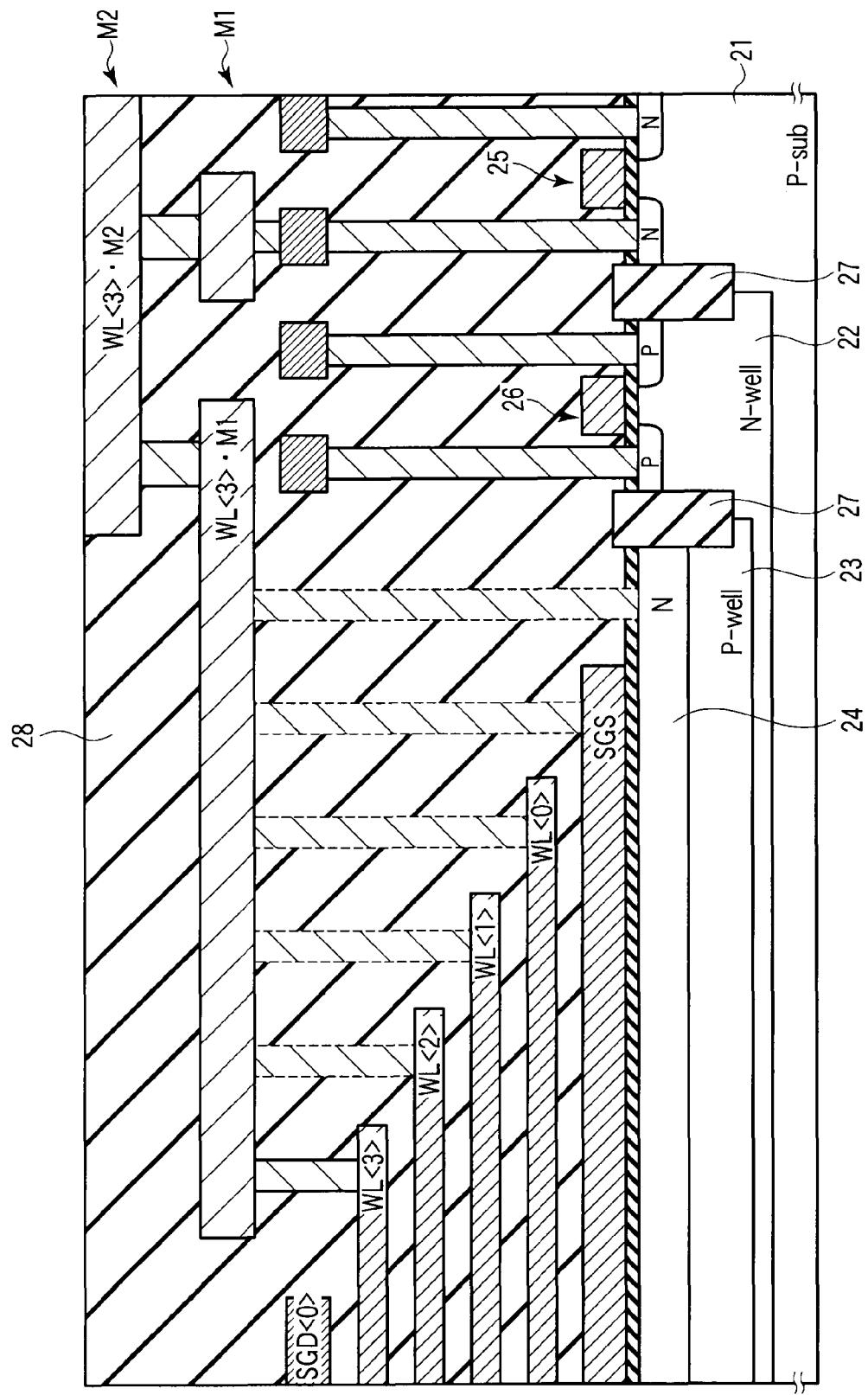
FIG. 3 is a sectional view taken along line III-III of FIG. 2.

FIG. 3 is a sectional view taken along line III-III of FIG. 2.

An N-type well region (N-well) 22 and a P-type well region (P-well) 23 are formed in a P-type semiconductor substrate (P-sub) 21. The source diffusion layer 24 is an N-type diffusion layer and formed in the P-type well region 23.

An N-channel FET (for example, N-channel MOSFET) 25 is formed in the P-type semiconductor substrate 21, and a P-channel FET (for example, P-channel MOSFET) 26 is formed in the N-type well region 22. These transistors comprise the peripheral circuit (for example, the drivers) formed in a peripheral portion of a memory cell array.

The select gate line SGS on the source line side and the word lines WL<0>, WL<1>, WL<2>, and WL<3> are connected to the transistors comprising the drivers through the interconnect line in a first metal layer M1 and through an interconnect line in a second metal layer M2 on the first metal layer M1.

To explain the word line WL<3> as an example, the word line WL<3> is connected to the N-channel FET 25 comprising a word line driver through the interconnect line WL<3>·M1 in the first metal layer M1 and through an interconnect line WL<3>·M2 in the second metal layer M2 on the first metal layer M1.

Here, gate electrodes of the N-channel FET 25 and the P-channel FET 26 are formed simultaneously with, for example, the select gate line SGS on the source line side.

That is, the gate electrodes of the N-channel FET 25 and the P-channel FET 26 have the same structure and the same thickness as those of the select gate line SGS on the source line side.

Figure 4:
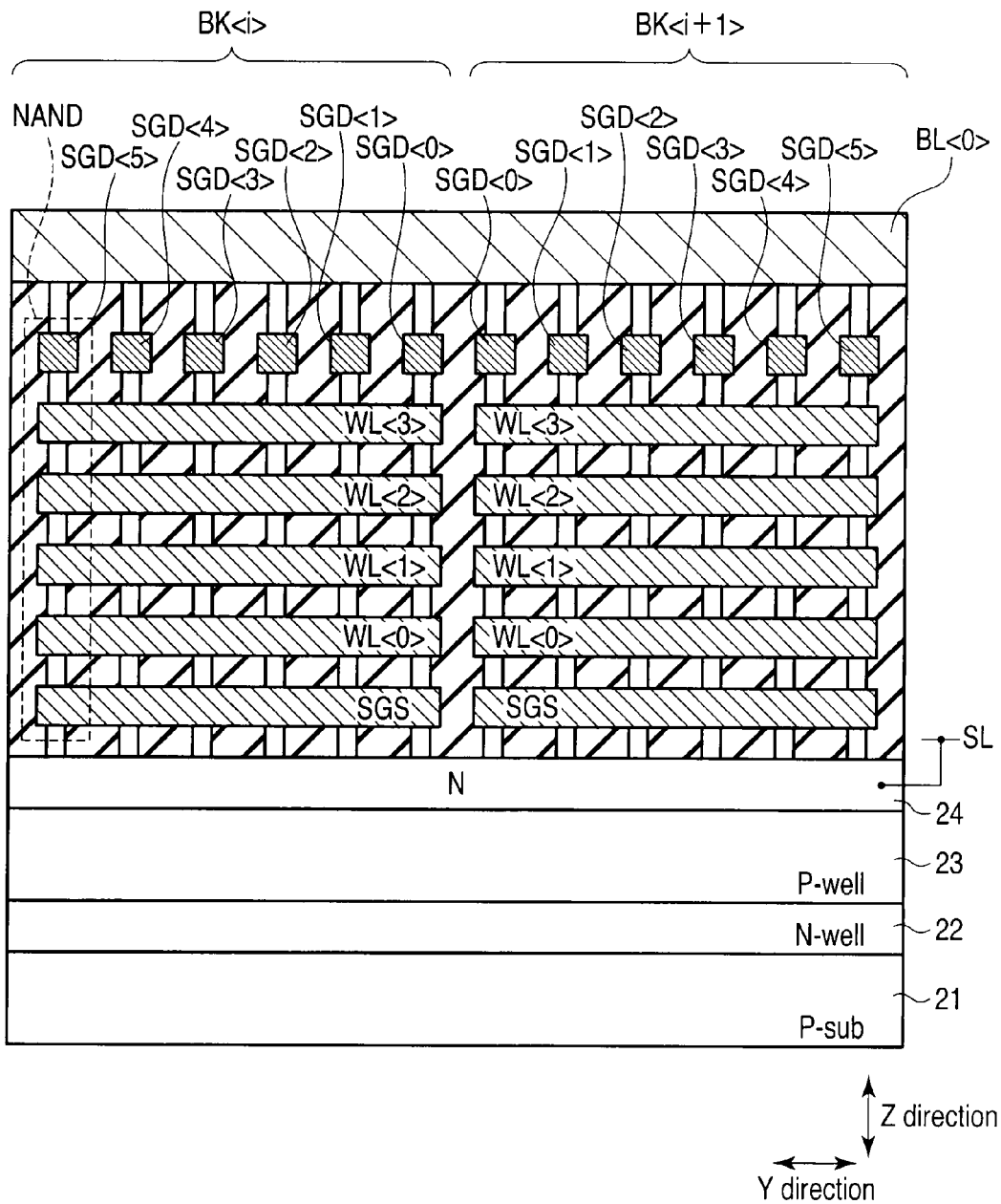
FIG. 4 is a sectional view taken along line IV-IV of FIG. 2.

FIG. 4 is a sectional view taken along line IV-IV of FIG. 2.

One ends (lowermost portions) of the active layers (active areas) AA are connected to the source diffusion layer 24 passing through the select gate line SGS on the source line side, the word lines WL<0>, WL<1>, WL<2>, and WL<3>, and the select gate lines SGD<0>, ..., SGD<5> on the bit line side, and the other ends (uppermost portions) thereof are connected to a bit line BL<0>.

The active layers AA are formed columnarly in the Z-direction (direction vertical to the front surface of the semiconductor substrate), and the NAND cell unit NAND is formed in each of the active layers AA.

FIG. 5 shows an example of a structure of the NAND cell unit NAND.

A memory cell MC has a MONOS structure.

The MONOS structure means a memory cell structure having a charge accumulation layer comprised of an insulation material such as nitride. The charge accumulation layer has a multilayer structure (charge trap layers), and ONO (oxide/nitride/oxide) is exemplified here.

A select gate transistor ST has the same structure as that of, for example, the memory cell MC.

However, a gate insulation film of the select gate transistor ST may have a structure different from that of the memory cell MC, i.e., may have a structure that includes no charge accumulation layer (for example, a single silicon oxide film).

Figure 6:
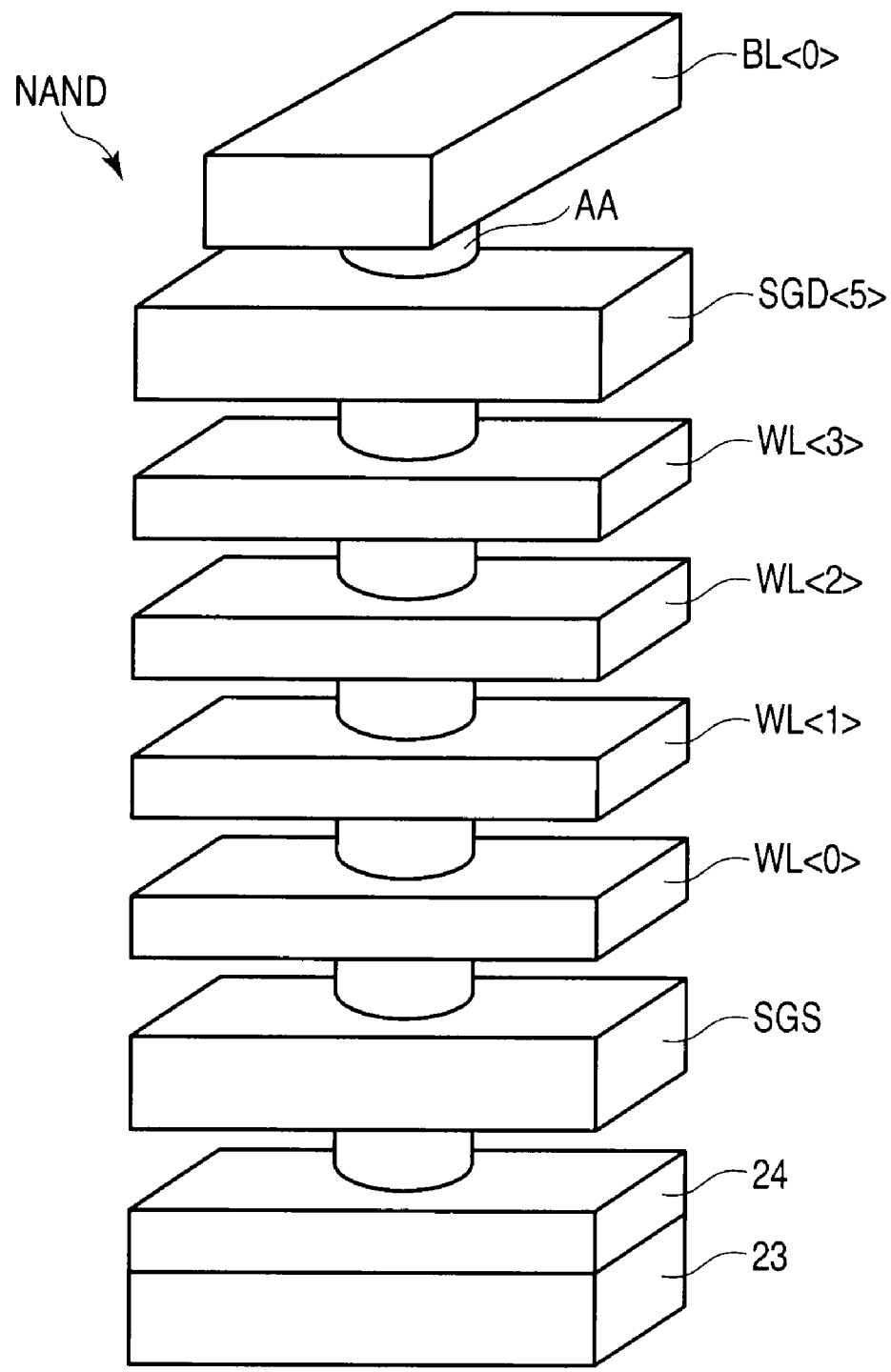
FIG. 6 is a bird's eye view of the NAND cell unit.

FIG. 6 shows a bird's eye view of the NAND cell unit.

One of the features of the NAND cell unit having a three dimensional structure resides in that each of the select gate line SGS on the source line side, the word lines WL<0>, WL<1>, WL<2>, and WL<3>, and the select gate lines SGD<0>, ..., SGD<5> on the bit line side has a structure for surrounding each of the side surfaces of the columnar active layers AA.

Accordingly, even if the active layers AA are made, for example, thinner and a larger number of the active layers AA are formed on the semiconductor substrate to increase a capacity, a force for driving the transistors comprising the NAND cell unit can be sufficiently secured.

Figure 7:
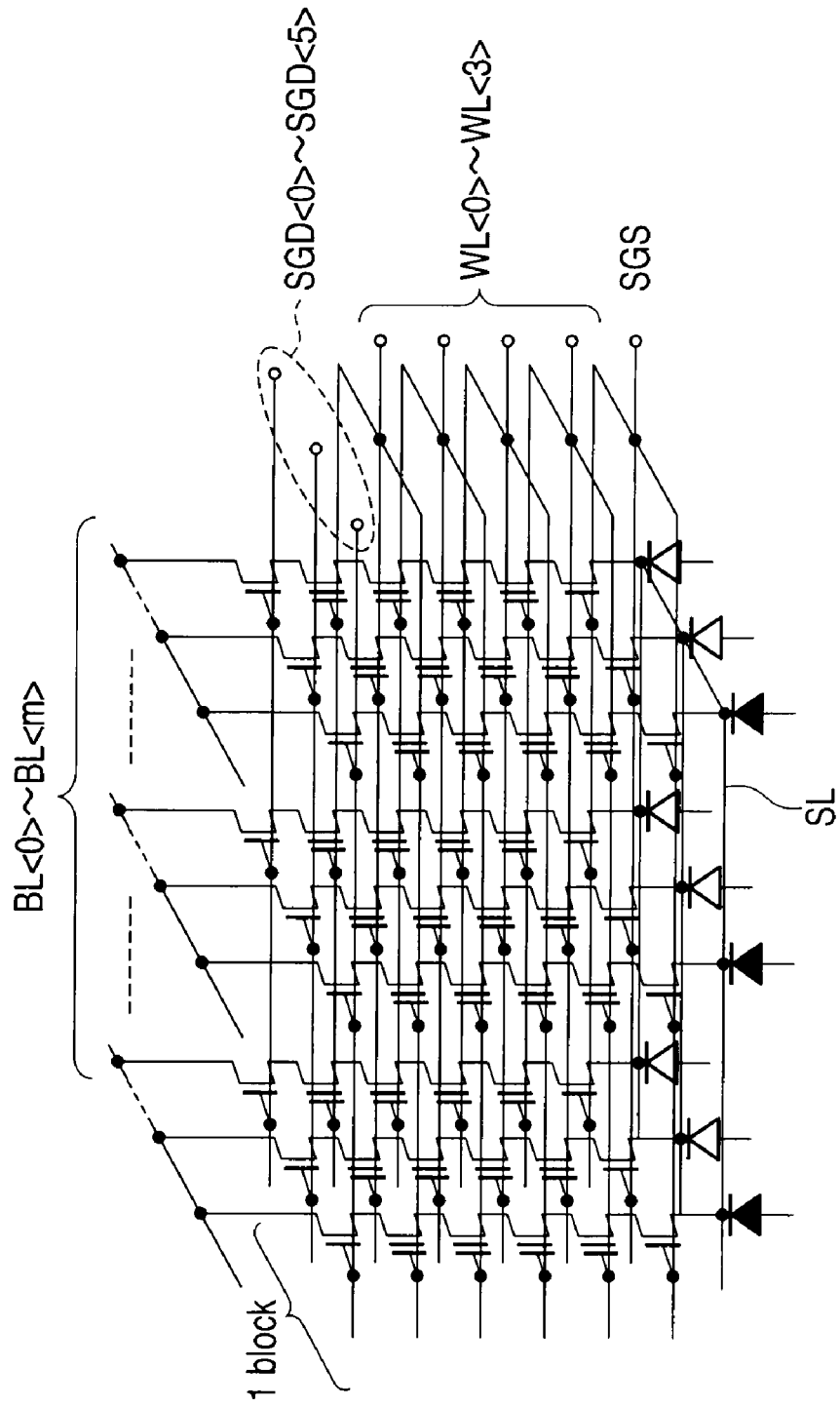
FIG. 7 is an equivalent circuit view of a memory cell array.

FIG. 7 shows an equivalent circuit of the memory cell array.

Since the BiCS-NAND flash memory has a three dimensional structure, the equivalent circuit is shown in a three dimension.

A larger number of memory cells comprising a NAND column can more contribute to an increase of the capacity. However, as the number of the memory cells comprising the NAND column is more increased, there is a possibility that the characteristics of the memory cells are dispersed in a manufacturing process from the characteristics of a BiCS structure.

When the dispersion of the characteristics is taken into consideration, the NAND column is comprised of a smaller number of the memory cells (for example, four memory cells, eight memory cells, and the like). Further, the same structure may be stacked on a structure shown by the equivalent circuit of FIG. 7.

Figure 8:
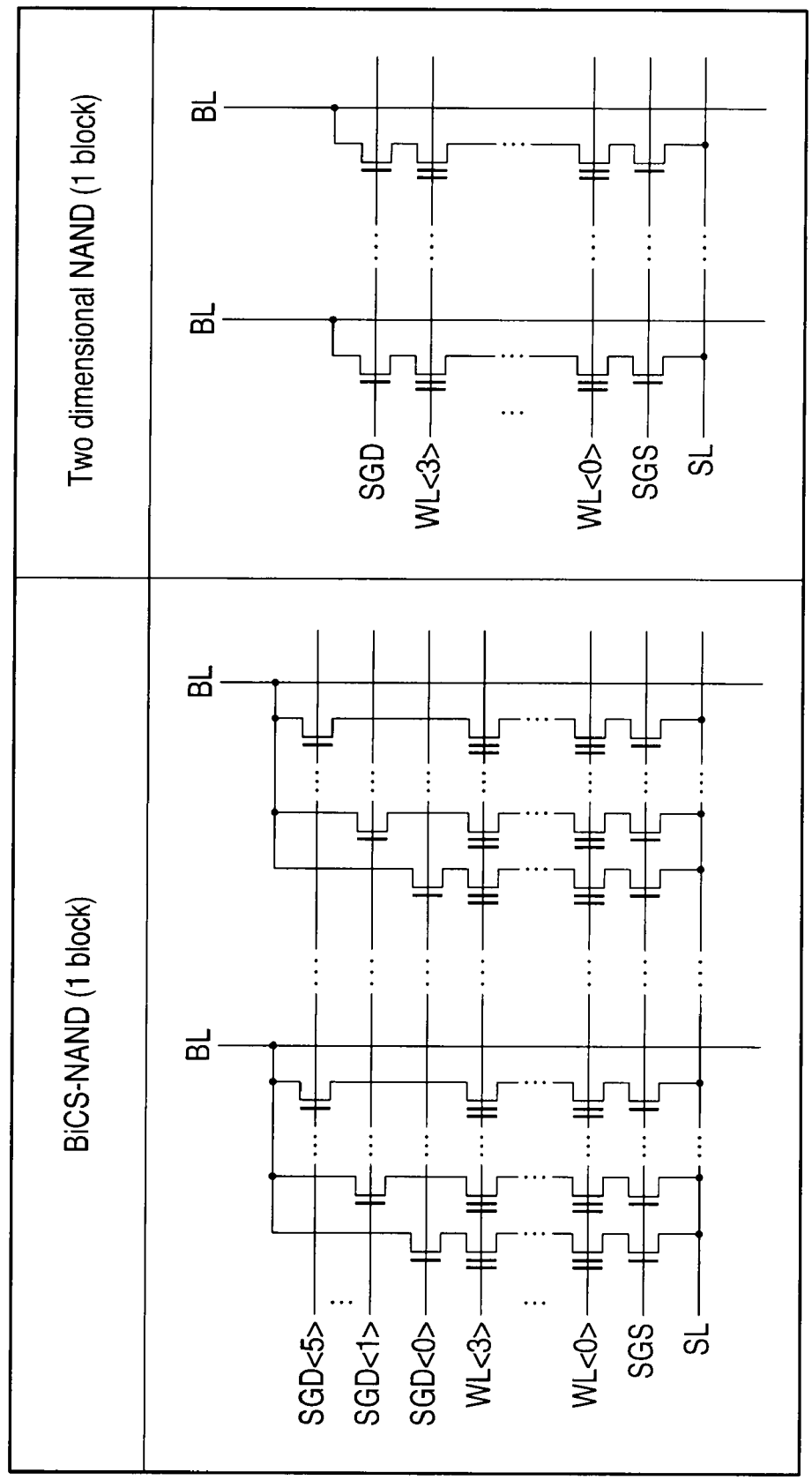
FIG. 8 is a comparative view comparing a BiCS-NAND with a two-dimensional NAND.

FIG. 8 is a view showing BiCS-NAND in comparison with two-dimensional NAND.

In the NAND flash memory having the two-dimensional structure (two-dimensional NAND), one NAND cell unit in one block is connected to one bit line BL, whereas in the BiCS-NAND, NAND cell units in one block are connected to one bit line BL.

Accordingly, as explained below, one of the cell units in the one block connected to the one bit line BL is selected by the select gate lines SGD<0>, ..., SGD<5> on the bit line side in a write operation and a read operation.

(2) Basic Operations

Basic operations of the BiCS-NAND flash memory of FIGS. 1 to 8 will be explained.

Since the basic write, read, and erase operations are the same as those of the NAND flash memory having the two-dimensional structure, matters specific to the BiCS-NAND flash memory will be explained here.

The concept of one block of the BiCS-NAND flash memory is different from that of the NAND flash memory having the two-dimensional structure.

Although the one NAND cell unit in the one block is connected to the one bit line BL in the NAND flash memory having the two-dimensional structure, the NAND cell units in the one block are connected to the one bit line BL in the BiCS-NAND flash memory.

For example, in the plan view of FIG. 2, six NAND cell units (corresponding to the number of the active layers AA in the figure) in the block BK<i+1> are connected to the bit line BL<0>.

Accordingly, in the write operation and the read operation, one of the six NAND cell units in the block BK<i+1> connected to the bit line BL<0> must be selected.

The selection is performed by select gate lines SGD<0>, ..., SGD<5> on the bit line side. The select gate lines SGD<0>, ..., SGD<5> on the bit line side are individually connected to six NAND cell units in the Y-direction in the block BK<i+1>.

The erase operation is performed collectively to, for example, all the memory cells in one block like the NAND flash memory having the two-dimensional structure.

The BiCS-NAND flash memory can be applied to both a binary memory, which stores binary data in one memory cell, and a multi-level memory which stores multi-level data having a ternary or more value in one memory cell.

3. Embodiments

Embodiments of the present invention will be explained.

(1) Block Layout

Figure 9:
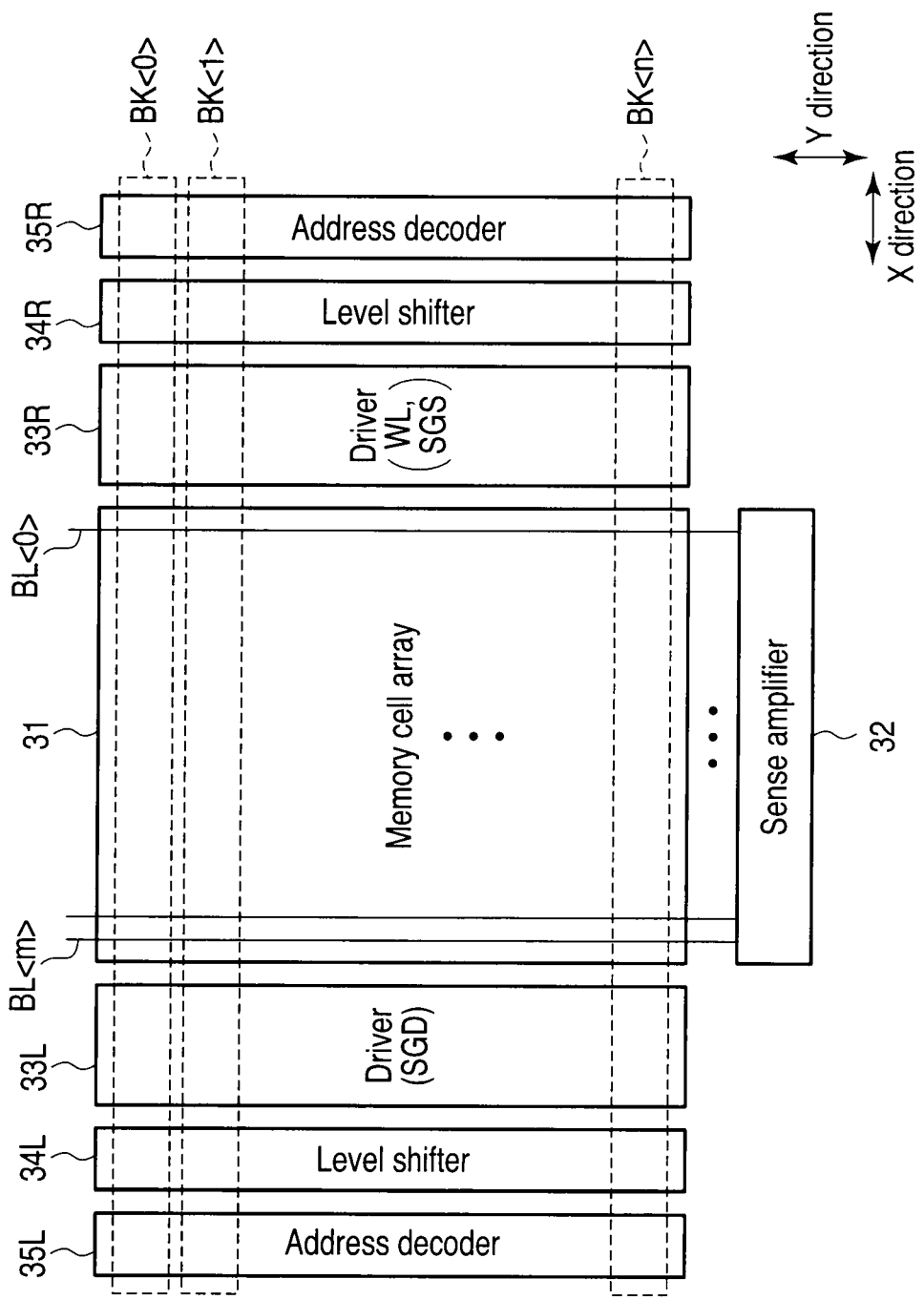
FIG. 9 is a view showing a first example of a block layout.

FIG. 9 shows a first example of a block layout of a BiCS memory.

The block layout corresponds to, for example, the BiCS-NAND flash memory of FIG. 1 and has a feature in that a select gate line driver on a bit line side is disposed on one end of a memory cell array and a word line driver and a select gate line driver on a source line side are disposed on the other end of the memory cell array.

A driver 33L, a level shifter 34L, and an address decoder 35L are disposed on one end of the memory cell array 31 in the X-direction (on a left side). The driver 33L is a driver for driving a select gate line SGD on the bit line side and includes a transfer transistor.

A driver 33R, a level shifter 34R, and an address decoder 35R are disposed on the other end of the memory cell array 31 in the X-direction (on a right side). The driver 33R is a driver for driving a word line WL and a select gate line SGS on the source line side and includes a transfer transistor.

Further, a sense amplifier 32 is disposed on one end of the memory cell array 31 in the Y-direction. Bit lines BL<0>, ..., BL<m> extending in the Y-direction are disposed on the memory cell array 31 and connected to the sense amplifier 32.

Since the block layout corresponds to the BiCS-NAND flash memory of FIG. 1, the select gate lines SGD on the bit line side are disposed in blocks BK<0>, BL<1>, ..., BK<n>, respectively. That is, since the area of the driver for driving the select gate lines SGD on the bit line side is increased, a select gate line driver on the bit line side is disposed on the one end of the memory cell array 31 in addition to the word line driver and the select gate line driver on the source line side disposed on the other end of the memory cell array 31.

FIG. 10 shows a second example of the block layout of the BiCS memory.

A feature of the second example resides in that drivers 33 for driving a word line WL, a select gate line SGS on a source line side, and a select gate line SGD on a bit line side are disposed together on one end of a memory cell array 31 in comparison with the first example.

The drivers 33, a level shifter 34, and an address decoder 35 are disposed on one end of the memory cell array 31 in the X-direction (on a left side). The drivers 33 are drivers for driving the word line WL, the select gate line SGS on the source line side, and the select gate line SDG on the bit line side and include transfer transistors.

Further, a sense amplifier 32 is disposed on one end of the memory cell array 31 in the Y-direction. Bit lines BL<0>, ..., BL<m> extending in the Y-direction are disposed on the memory cell array 31 and connected to the sense amplifier 32.

Since the drivers 33 for driving the word line WL, the select gate line SGS on the source line side and the select gate line SGD on the bit line side are disposed together as described above, an address decoder 34 and a level shifter 35 can be also disposed together at the same position. As a result, a layout of a peripheral circuit can be made efficiently.

However, in the above block layout, when the size of the memory cell array 31 is increased and further a memory cell is miniaturized and the word line WL, the select gate line SGS on the source line side and the select gate line SGD on the bit line side are disposed at narrow pitches, a problem arises in that a signal is delayed by a parasitic capacitance.

In particular, in the BiCS memory, the word line WL and the select gate line SGS on the source line side are formed in a plate shape. Accordingly, coupling noise is caused by an increase of a parasitic capacitance between the conductive wires.

FIG. 11 shows a third example of the block layout of the BiCS memory.

A feature of the third example resides in that two memory cell arrays 31L and 31R are disposed in comparison with the second example. Since disposition of the two memory cell arrays 31L and 31R can reduce the lengths of a word line WL, a select gate line SGS on a source line side, and a select gate line SGD on a bit line side in each memory cell array, a signal delay and coupling noise can be suppressed.

The memory cell arrays 31L and 31R are disposed in the X-direction side by side. Drivers 33L and 33R, a level shifter 34, and an address decoder 35 are interposed between the memory cell arrays 31L and 31R. The drivers 33L and 33R drive the word line WL, the select gate line SGS on the source line side, and the select gate line SGD on the bit line side and include transfer transistors.

Further, sense amplifiers 32L and 32R are disposed on one ends of the memory cell arrays 31L and 31R in the Y-direction. Bit lines BL<0>, ..., BL<m> extending in the Y-direction are disposed on the memory cell arrays 31L and 31R and connected to the sense amplifiers 32L and 32R.

Although the level shifter 34 and the address decoder 35 are shared by the two memory cell arrays 31L and 31R in the block layout, the driver 33L is disposed in correspondence with the memory cell array 31L, and the driver 33R is disposed in correspondence with the memory cell array 31R.

A reason why the drivers 33L and 33R cannot be shared by the two memory cell arrays 31L and 31R as described above is that since the drivers are comprised of a lot of transistors, when they are shared by the memory cell arrays 31L and 31R, a layout of wirings for connecting the memory cell arrays 31L and 31R to the drivers 33L and 33R is made complex. That is, when a driver is disposed on each memory cell array, a layout of wirings is more simplified than a case in which the drivers are shared by the two memory cell arrays.

Figure 12:
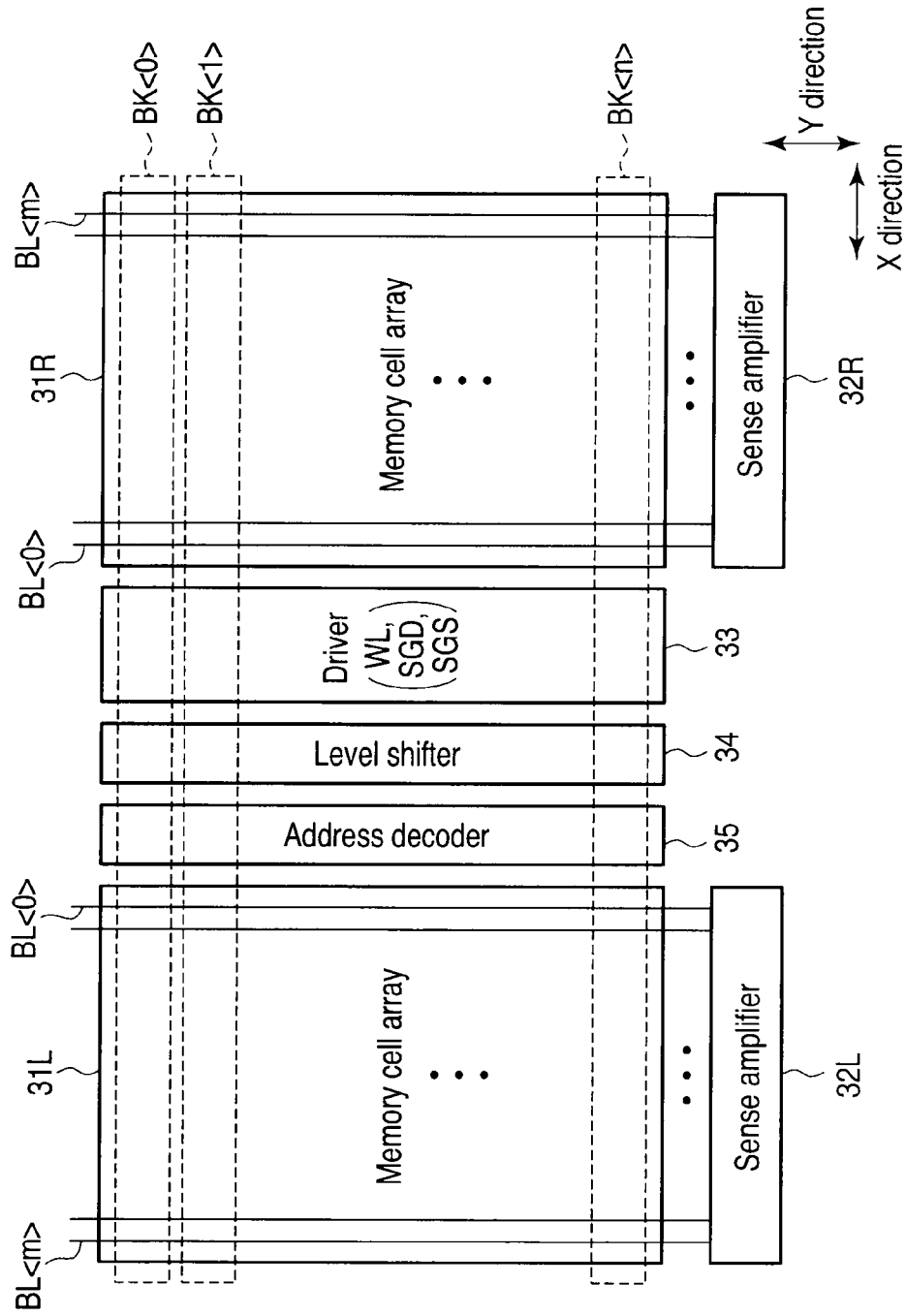
FIG. 12 is a view showing a fourth example of the block layout.

FIG. 12 shows a fourth example of the block layout of the BiCS memory.

A feature of the fourth example resides in that a driver 33 for driving a word line WL, a select gate line SGS on a source line side, and a select gate line SGD on a bit line side is shared by two memory cell arrays 31L and 31R in comparison with the third example.

The driver 33 can be shared by reducing the area thereof, i.e., by reducing the number of transistors comprising the driver 33. More specifically, this is because a layout of wirings for connecting the memory cell arrays 31L and 31R to the drivers 33L and 33R is not made complex by reducing the number of the transistors. Although the number of the transistors comprising the driver 33 is reduced by a layout of the select gate line on the bit line side according to the present invention, this will be described later and only the block layout will be explained here.

The memory cell arrays 31L and 31R are disposed in the X-direction side by side. The driver 33, a level shifter 34, and an address decoder 35 are interposed between the memory cell arrays 31L and 31R. The driver 33 drives the word line WL, the select gate line SGS on the source line side and the select gate line SGD on the bit line side and includes a transfer transistor.

Further, sense amplifiers 32L and 32R are disposed on one ends of the memory cell arrays 31L and 31R in the Y-direction. Bit lines BL<0>, . . . , BL<m> extending in the Y-direction are disposed on the memory cell arrays 31L and 31R and connected to the sense amplifiers 32L and 32R.

In the block layout, the driver 33, the level shifter 34, and the address decoder 35 are shared by the two memory cell arrays 31L and 31R.

Note that if the driver 33 can be shared by the two memory cell arrays 31L and 31R without making a wiring layout complex, the block layout of the fourth example will be most preferable in the first to fourth examples.

(2) Layout of Select Gate Line on Bit Line Side

Figure 13:
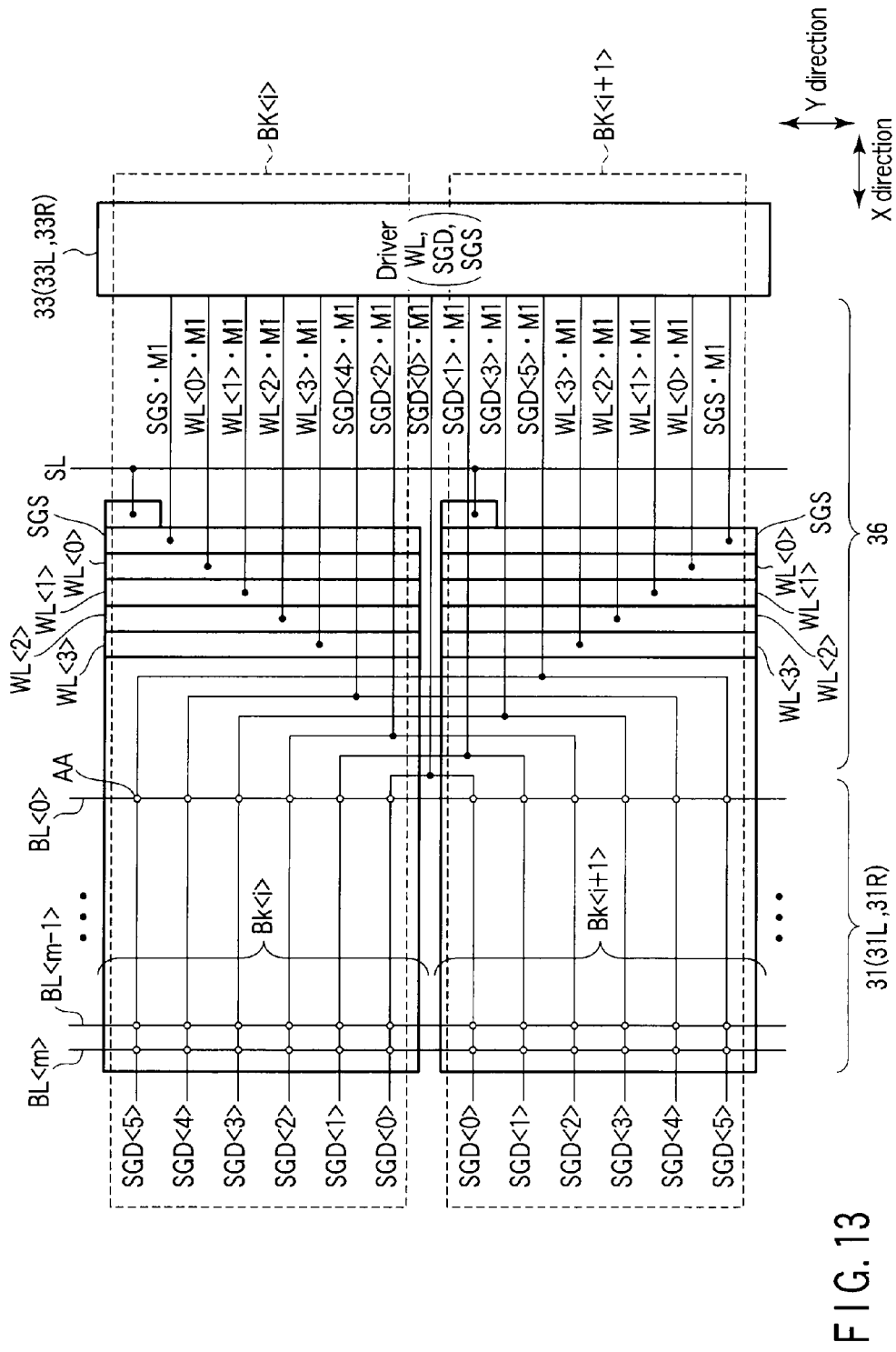
FIG. 13 shows a layout of select gate lines on a bit line side.

FIG. 13 shows a conceptual diagram of a layout of select gate lines on a bit line side. FIG. 14 shows a layout viewed on a plan view when the select gate lines shown in FIG. 13 are arranged as a device.

This example corresponds to the block layout of FIGS. 10 to 12. That is, a driver 33 (33L and 33R) disposed on one end (right side) of a memory cell array 31 in the X-direction is connected to word lines WL<0>, . . . , WL<3>, a select gate line SGS on a source line side, and select gate lines SGD<0> . . . , SGD<5> on a bit line side.

Attention must be paid to the fact that the portions, to which the layouts of FIGS. 13 and 14 are applied as they are, are limited to the portion between the memory cell array 31L and the driver 33L of FIG. 11 and to the portion between the memory cell array 31L and the driver 33 of FIG. 12.

The layouts, which are obtained by reversing the layouts of FIGS. 13 and 14 in a right to left direction, are applied to the remaining portions between the memory cell array 31 and the driver 33 of FIG. 10, between the memory cell array 31R and the driver 33R of FIG. 11, and between the memory cell array 31R and the driver 33 of FIG. 12.

Each of two blocks BK<i>, BK<i+1> is comprised of at least three conductive layers, which are insulated from each other and stacked on a semiconductor substrate, bit lines BL<0>, . . . , BL<m>, which are insulated from the at least three conductive layers and disposed thereon, and active layers (columnar semiconductors) AA whose lower ends are connected to the semiconductor substrate, whose upper ends are connected to the bit lines BL<0>, . . . , BL<m>, and which pass through the at least three conductive layers.

The uppermost layer of the at least three conductive layers is comprised of the select gate lines SGD<0>, . . . , SGD<5> on the bit line side, the lowermost layer of the at least three conductive layers is a select gate line SGS on the source line side, and the remaining conductive layers excluding the uppermost and lowermost layers of the at least three conductive layers are the word lines WL<0>, . . . , WL<3>.

In the second example, although the number of the select gate lines SGD<0>, . . . , SGD<5> on the bit line side is six and the number of the word lines WL<0>, . . . , WL<3> is four in one block, respectively, the numbers are not limited thereto. That is, it is sufficient that the number of the select gate lines on the bit line side and the number of the word lines be at least one in the one block, respectively.

Further, the remaining conductive layers excluding the uppermost layer of the at least three conductive layers have a plate shape whose width in the Y-direction is larger than the width in the Y-direction of the select gate lines SGD<0>, . . . , SGD<5> on the bit line side.

Select gate transistors on the bit line side are comprised of the select gate lines SGD<0>, . . . , SGD<5> on the bit line side and the active layers AA, and select gate transistors on the source line side are comprised of the select gate line SGS on the source line side and the active layers AA. Further, memory cells are comprised of the word lines WL<0>, . . . , WL<3> and the active layers AA.

Further, the region between the memory cell array 31 (31L and 31R) and the driver 33L (33L and 33R) is arranged as an interconnect portion 36 in which interconnect lines (conductive wires) WL<0>·M1, . . . , WL<3>·M1, SGS·M1, SGD<0>·M1, . . . , SGD<5>·M1 are disposed to connect the memory cell array 31 to the driver 33.

The select gate lines SGD<0>, . . . , SGD<5> on the bit line side in the block BK<i> and the select gate lines SGD<0>, . . . , SGD<5> on the bit line side in the block BK<i+1> are connected to the driver 33 (33L and 33R) after they are commonly connected in the relation of one to one in one end in the X-direction (right side) of the memory cell array 31.

Specifically, an i-th (i is a natural number) select gate line on the bit line side from the block BK<i+1> side of the select gate lines SGD<0>, . . . , SGD<5> on the bit line side in the block BK<i> is commonly connected to an i-th select gate line on the bit line side from the block BK<i> side of the select gate lines SGD<0>, . . . , SGD<5> on the bit line side in the block BK<i+1>.

Accordingly, the select gate lines SGD<0>, . . . , SGD<5> on the bit line side have a folded layout in their entirety.

The folded layout can be easily formed by making use of, for example, a side wall masking technology for etching a ground layer using a side wall as a mask.

FIG. 15 shows a layout in which drivers are disposed on both the sides of a memory cell array.

As shown in FIG. 15, when the drivers 33 are disposed on both the sides of the memory cell array 31, the size of the drivers 33 in the Y-direction per, for example, one block can be increased (the number of transistors can be increased). As a result, since the size of the drivers 33 in the X-direction can be decreased (the number of transistors can be decreased), the layout of interconnect lines (conductive wires) WL<0>·M1, . . . , WL<3>·M1, SGS·M1, SGD<0>·M1, . . . , SGD<5>·M1 in an interconnect portion 36 is further simplified.

Note that whether the drivers 33 (33L and 33R) are disposed on one sides of the memory cell arrays 31 (31L and 31R) as shown in FIGS. 10 to 12 or the drivers 33 are disposed on both the sides of the memory cell array 31 as shown in FIG. 15 is determined in consideration of the specification of the BiCS memory (chip), the area efficiency of the peripheral circuit, and the like.

(3) Structure of Conductive Layer on Driver

A structure of a conductive layer on a driver will be explained.

A. Reference Example

Figure 16:
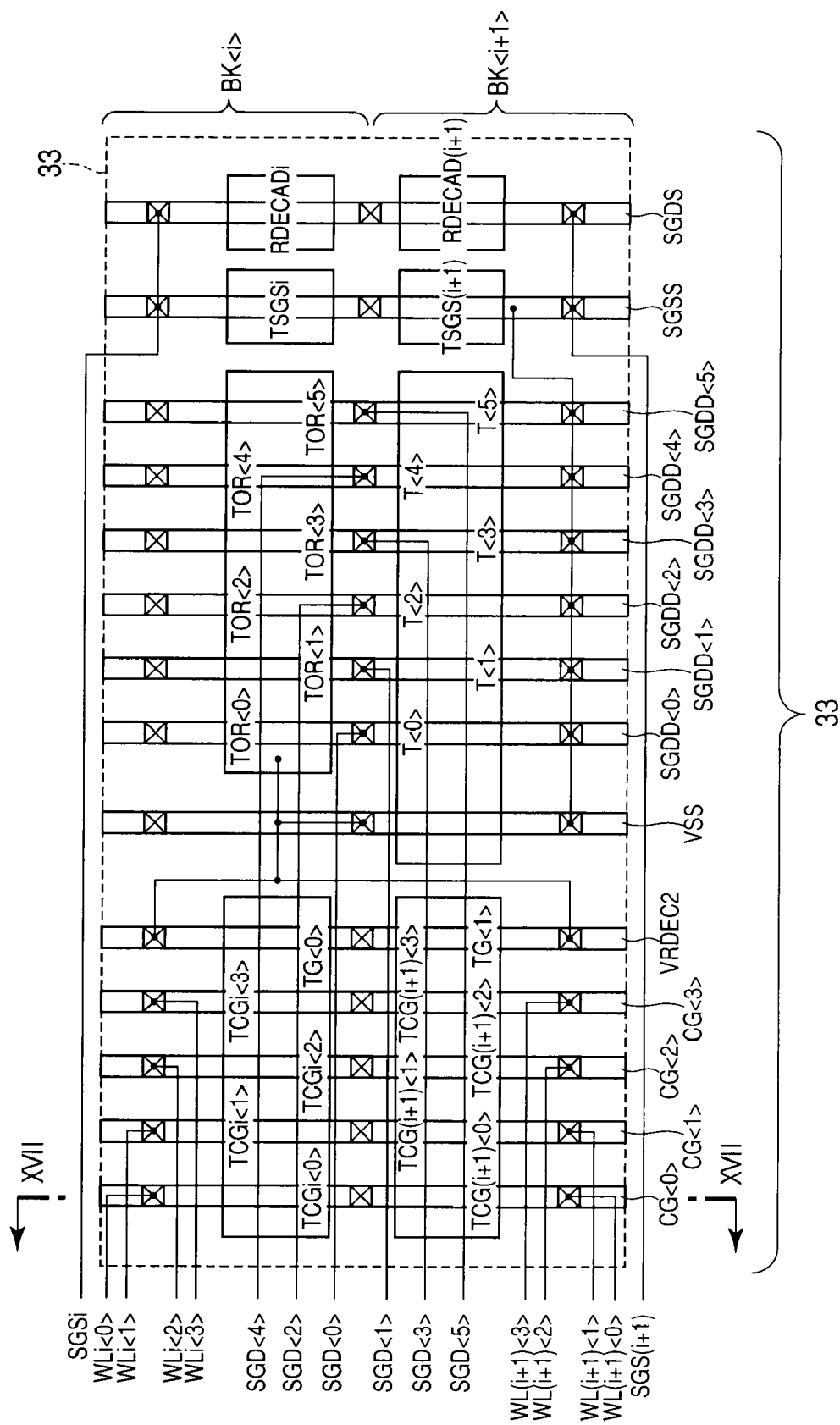
FIG. 16 is a plan view showing a layout as a reference example.
Figure 17:
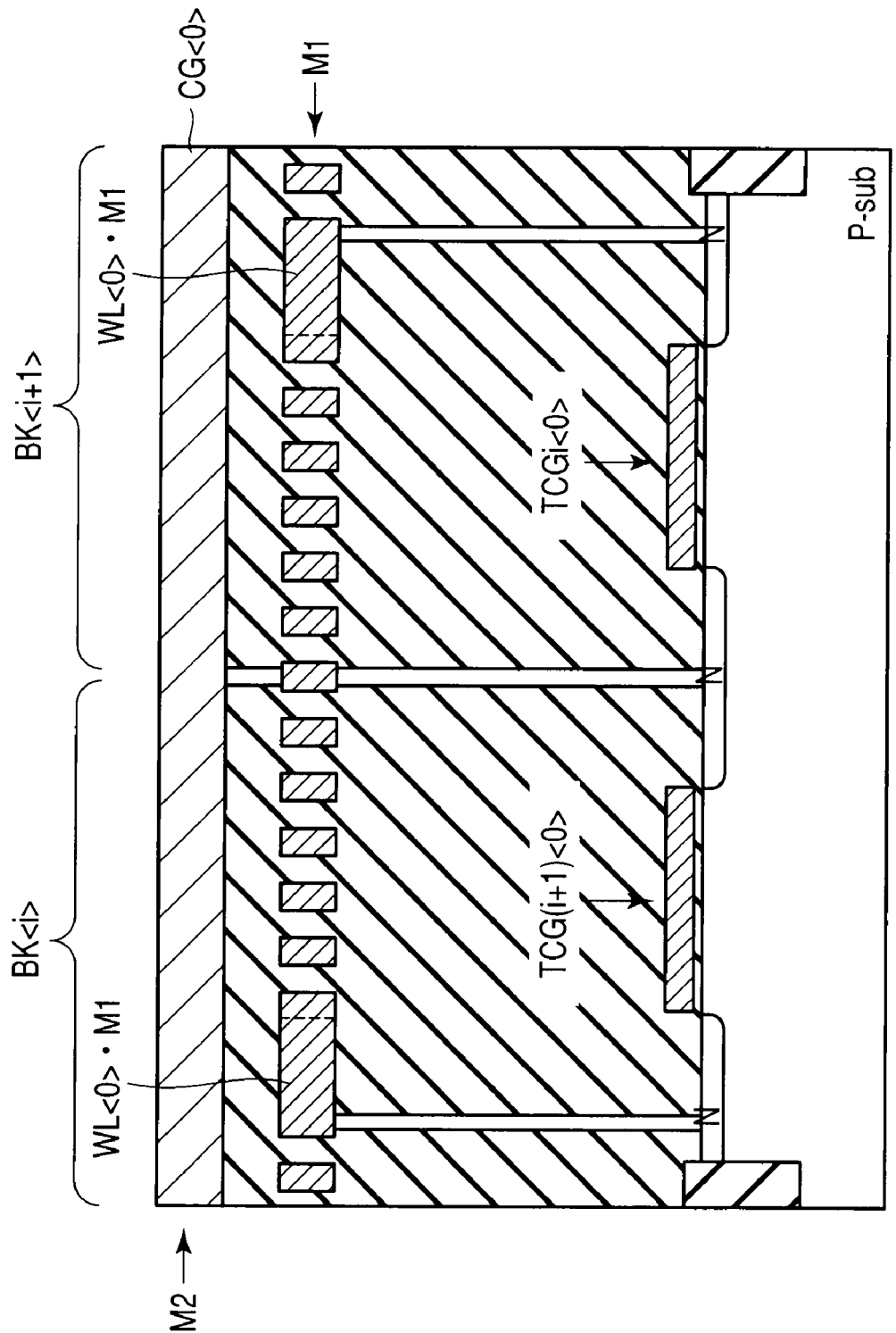
FIG. 17 is a sectional view taken along line XVII-XVII of FIG. 16.

FIG. 16 shows a plan view of the conductive layer structure as a reference example. FIG. 17 is a sectional view taken along line XVII-XVII of FIG. 16.

Here, two blocks BK<i>, BK<i+1> are shown corresponding to the layouts of FIGS. 13 and 14.

A driver 33 is comprised of a transfer transistors (high voltage transistors) to which a high voltage is applied. A transfer transistor TCGi<3:0> connects a conductive wire CG<3:0> to a word line WLi<3:0> in the block BK<i>, and a transfer transistor TCG(i+1)<3:0> connects the conductive wire CG<3:0> to a word line WL(i+1)<3:0> in the block BK<i+1>.

A transfer transistor TOR<5:0> connects a conductive wire SGDD<5:0> to select gate lines SGD<5:0> on the bit line side in the blocks BK<i>, BK<i+1>, and a transfer transistor T<5:0> connects a conductive wire SGDS to the select gate lines SGD<5:0> on the bit line side in the blocks BK<i>, BK<i+1>.

A transfer transistor Q connects a ground line Vss to a gate terminal of the transfer transistor TOR<5:0>. A gate terminal of the transfer transistor Q is connected to a gate terminal of the transfer transistor T<5:0>. A transfer transistor TG<0> connects a conductive wire VRDEC2 to the gate terminal of the transfer transistor TOR<5:0>, and a transfer transistor TG<1> connects the conductive wire VRDEC2 to the gate terminal of the transfer transistor TOR<5:0>.

A transfer transistor TSGSi connects a conductive wire SGSS to a select gate line SGSi on a source line side in the block BK<i>, and a transfer transistor TSGS(i+1) connects the conductive wire SGSS to a select gate line SGS(i+1) on the source line side in the block BK<i+1>.

A transfer transistor RDECADi connects the conductive wire SGDS to the select gate line SGSi on the source line side in the block BK<i>, and a transfer transistor RDECAD(i+1) connects the conductive wire SGDS to the select gate line SGS(i+1) on the source line side in the block BK<i+1>.

As described above, there are a very large number of the conductive wires which connect the blocks BK<i>, BK<i+1> in a memory cell array to the transfer transistors in the driver 33.

In this case, when no conductive layer exists between the transfer transistors TCGi<0>, TCG(i+1)<0> and a first metal layer M1 as shown in the sectional view of FIG. 17, a wiring is made complex, and it is actually impossible to connect the memory cell array to the driver 33.

B. Embodiments

Figure 18:
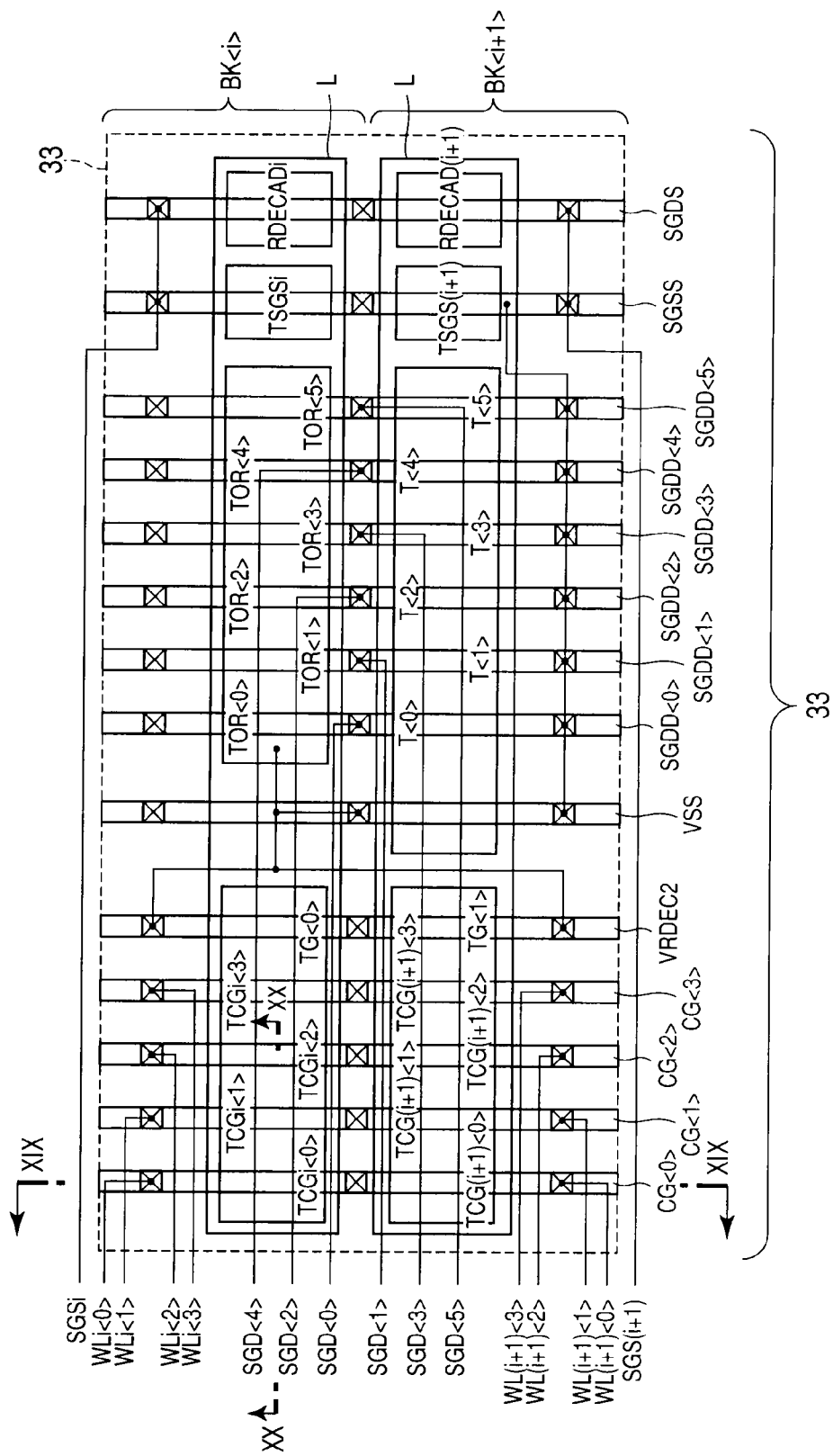
FIG. 18 is a plan view showing a layout as an embodiment.
Figure 20:
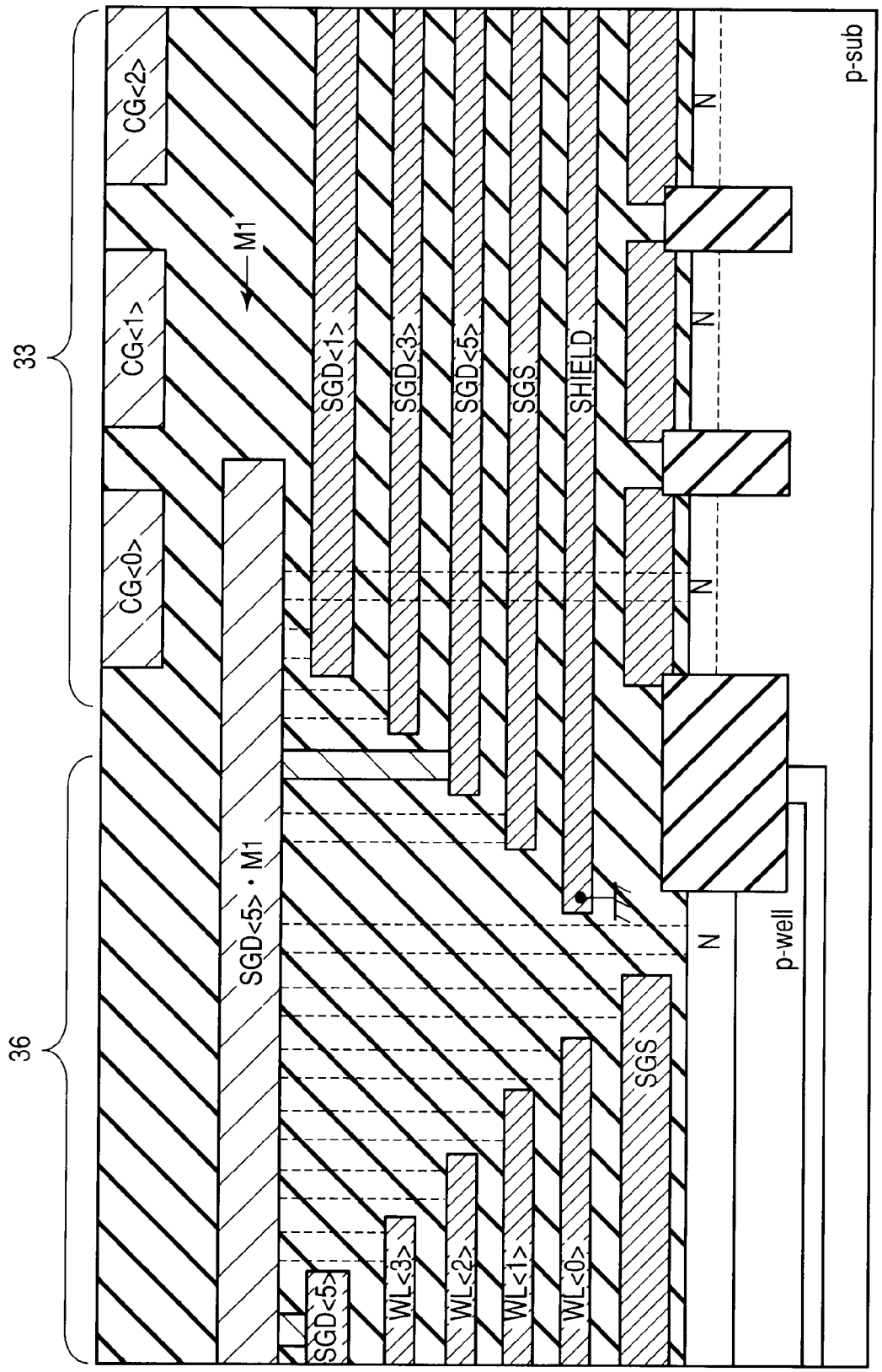
FIG. 20 is a sectional view taken along line XX-XX of FIG. 18.

FIG. 18 shows a plan view of a conductive layer structure as an embodiment. FIG. 19 is a sectional view taken along line XIX-XIX of FIG. 18, and FIG. 20 is a sectional view taken along line XX-XX of FIG. 18.

The embodiment shows two blocks BK<i>, BK<i+1> corresponding to the layouts of FIGS. 13 and 14 also in the embodiment likewise the reference example described above.

A driver 33 is comprised of transfer transistors (high voltage transistors) to which a high voltage is applied. A transfer transistor TCGi<3:0> connects a conductive wire CG<3:0> to a word line WLi<3:0> in the block BK<i>, and a transfer transistor TCG(i+1)<3:0> connects the conductive wire CG<3:0> to a word line WL(i+1)<3:0> in the block BK<i+1>.

A transfer transistor TOR<5:0> connects a conductive wire SGDD<5:0> to select gate lines SGD<5:0> on a bit line side in the blocks BK<i>, BK<i+1>, and a transfer transistor T<5:0> connects a conductive wire SGDS to the select gate lines SGD<5:0> on the bit line side in the blocks BK<i>, BK<i+1>. A transfer transistor Q connects a ground line Vss to a gate terminal of the transfer transistor TOR<5:0>. A gate terminal of the transfer transistor Q is connected to a gate terminal of the transfer transistor T<5:0>. A transfer transistor TG<0> connects a conductive wire VRDEC2 to the gate terminal of the transfer transistor TOR<5:0>, and a transfer transistor TG<1> connects the conductive wire VRDEC2 to the gate terminal of the transfer transistor TOR<5:0>.

A transfer transistor TSGSi connects a conductive wire SGSS to a select gate line SGSi on a source line side in the block BK<i>, and a transfer transistor TSGS(i+1) connects the conductive wire SGSS to a select gate line SGS(i+1) on the source line side in the block BK<i+1>.

A transfer transistor RDECADi connects the conductive wire SGDS to the select gate line SGSi on the source line side in the block BK<i>, and a transfer transistor RDECAD(i+1) connects the conductive wire SGDS to the select gate line SGS (i+1) on the source line side in the block BK<i+1>.

The embodiment is different from the reference example in that at least three conductive layers L having the same structure as that of at least three conductive layers in the blocks BK<i>, BK<i+1> are disposed on the driver 33 in order to connect the blocks BK<i>, BK<i+1> in a memory cell array to the transfer transistors in the driver 33. At least the select gate line SGD<5:0> on the bit line side is connected to the driver 33 using the at least three conductive layers L.

In this case, since at least three conductive layers (five conductive layers in the example) are interposed between the transfer transistors TCGi<0>, TCG(i+1)<0> and a first metal layer M1 likewise in the memory cell array as shown in sectional views of FIGS. 19 and 20, complexity of the wiring can be suppressed and the driver 33 can be easily connected to the memory cell array.

Note that, in the embodiment, the at least three conductive layers on the driver 33 are used as to the word lines WLi<5:0>, WL(i+1)<5:0>, the select gate line SGD<5:0> on the bit line side, and the select gate line SGSi, SGS(i+1) on the source line side. However, when these conductive layers are used as to at least one of them, an advantage of suppressing the complexity of the wiring by the present invention can be obtained.

Further, in the embodiment, the at least three conductive layers on the driver 33 have a plate shape in which the width of the at least three conductive layers in a first direction, in which, for example, the blocks BK<i>, BK<i+1> are disposed, is larger than that of the select gate lines on the bit line side in the memory cell array in the first direction. However, the embodiment is not limited thereto, and the width and the pattern of the at least three conductive layers on the driver 33 can be appropriately modified from the viewpoint of easiness of design, manufacture, and the like.

Further, in the embodiment, the lowermost layer of the at least three conductive layers on the driver 33 is arranged as a sealed line SHIELD fixed to a ground potential Vss. With this arrangement, the transfer transistors TCGi<0>, TCG(i+1)<0> can be prevented from interfering with the at least three conductive layers formed thereon. It is also possible to prevent interference between signal lines by appropriately disposing the sealed line SHIELD in the at least three conductive layers on the driver 33.

Further, at least one of the at least three conductive layers on the driver 33 may be arranged as a dummy layer in an electrically floating state or as a power supply layer for supplying a power supply potential (for example, a plus power supply potential, a ground potential, and the like) to the memory cell array and a peripheral circuit.

The embodiment is based on a premise of the layout of FIGS. 13 and 14, i.e., on a premise that the select gate lines on the bit line side in the block BK<i> and the select gate lines on the bit line side in the block BK<i+1> are connected to the driver 33 after the former select gate lines are commonly connected to the latter select gate lines in the relation of one to one.

However, a predetermined advantage for suppressing complexity of a wiring can be also obtained to a device, in which select gate lines on a bit line side are not commonly shared, by applying the present invention thereto.

(4) Advantages

According to the present invention, a wiring for connecting a memory cell of a three dimensional stacked nonvolatile semiconductor memory, to which a BiCS technology is applied, to a driver thereof can be suppressed from being made complex.

Further, it is possible to realize a layout, in which a memory cell array having a predetermined storage capacity is divided to memory cell array subunits and a driver shared by the memory cell array subunits are interposed therebetween, for example, a layout shown in FIG. 12 particularly in a BiCS memory.

Since the layout of FIG. 12 can suppress a signal delay caused by a CR time constant of word lines, select gate lines on a bit line side, and select gate lines on a source line side to about one fourth as compared with the layouts of FIGS. 9 and 10, it can contribute to increase an operation speed of a core unit.

Figure 21:
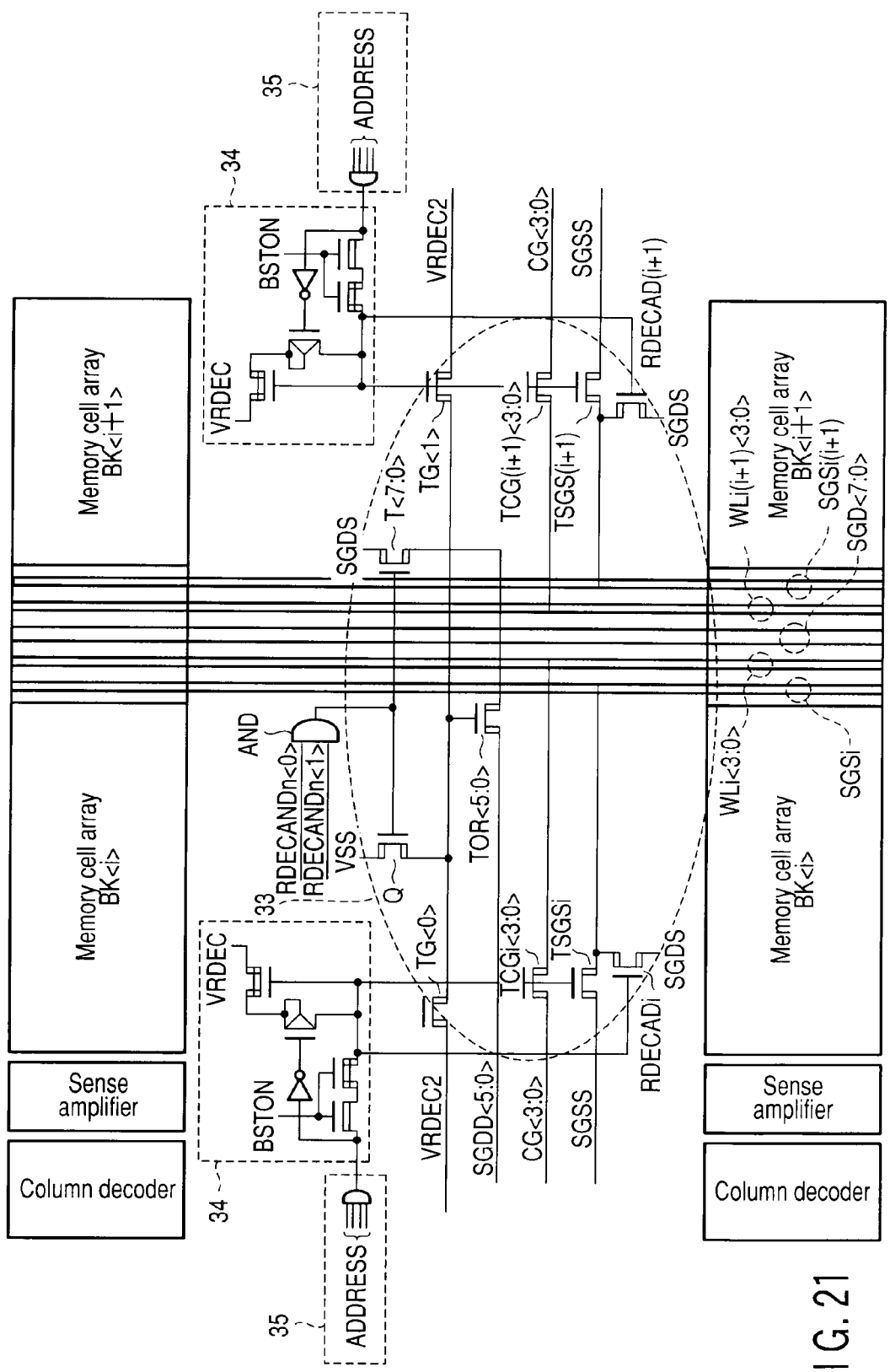
FIG. 21 is a circuit diagram showing a driver according to an example of the present invention.

FIG. 21 shows a driver of a BiCS-NAND flash memory in detail.

FIG. 21 corresponds to the layout of FIG. 12 and to the structures of FIGS. 18 to 20.

It is assumed that the number of word lines is four (four layers), the number of select gate lines on a bit line side is 6 (one layer), and the number of select gate lines on a source line side is one (one layer), respectively in one block.

A driver 33 is comprised of transfer transistors (high voltage transistors) to which a high voltage is applied. Each of row decoders 35 is comprised of an AND circuit and decodes an address signal ADDRESS. Level shifters 34 are connected between the driver 33 and the row decoders 35.

BSTON, VRDEC, RDECANDn<0>, and RDECANDn<1> are control signals for turning on and off transfer transistors, and SGDD<5:0>, CG<3:0>, SGSS, RDECADi, RDECAD(i+1), and SGDS are transfer voltages.

In the example, 27 transfer transistors are necessary to two blocks BK<i>, BK<i+1>.

The 27 transfer transistors are broken down as follows:
8 transfer transistors TCGi<3:0>, TCG(i+1)<3:0> to 8 (=4×2 blocks) word lines WL<3:0> in the blocks BK<i>, BK<i+1>;
15 transfer transistors TOR<5:0>, T<5:0>, TG<0>, TG<1>, and Q to 12 (=6×2 blocks) select gate lines SGD<5:0> on the bit line side in the blocks BK<i>, BK<i+1>; and
4 transfer transistors TSGSi, TSGS(i+1), RDECADi, and RDECAD(i+1) to 2 (=1×2 blocks) select gate line SGS on the source line side in the blocks BK<i>, BK<i+1>.

As described above, in the example, it is sufficient to provide the 27 transfer transistors to the two blocks. That is, an increase of the area of a peripheral circuit can be suppressed in the BiCS-NAND flash memory having the four word lines (four layers), the six select gate lines on the bit line side (one layer), and the one select gate line on the source line side (one layer).

The example of the present invention can contribute to practical use of a BiCS memory.

(5) Conclusion

As described above, according to the embodiment of the present invention, a wiring for connecting a memory cell of a three dimensional stacked nonvolatile semiconductor memory, to which a BiCS technology is applied, to a driver thereof can be suppressed from being made complex.

According to the present invention, the wiring for connecting the memory cell of the three dimensional stacked nonvolatile semiconductor memory, to which the BiCS technology is applied, to the driver thereof can be suppressed from being made complex.

4. Application Example

Although the technology of the present invention is effective for a BiCS-NAND flash memory in which one cell unit is comprised of memory cells (NAND columns) connected to each other in series to realize bit cost scalability, the technology can be also applied to a three dimensional stacked nonvolatile semiconductor memory to which the BiCS technology is applied in addition to the above BiCS-NAND flash memory.

For example, the technology of the present invention is also effective for a nonvolatile semiconductor memory which has exactly the same device structure as that of the BiCS-NAND flash memory but in which only one central memory cell of memory cells in one cell unit is used as a memory cell and the remaining memory cells are used as dummy cells as an example other than the BiCS-NAND flash memory.

Further, as to a memory cell structure of the BiCS memory, it is considered that a so-called MONOS type, in which a charge accumulation layer is comprised of an insulation material (for example, nitride), is effective, but the example of the present invention is not limited thereto and can be also applied to a floating gate type in which a charge accumulation layer is comprised of conductive polysilicon.

Further, a data value stored in one memory cell may be a binary value (two-level) or a multivalue (multi-level) of at least a ternary value (three-level).

5. Advantages

According to the present invention, a wiring for connecting a memory cell of a three dimensional stacked nonvolatile semiconductor memory, to which a BiCS technology is applied, to a driver thereof can be suppressed from being made complex.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A three dimensional stacked nonvolatile semiconductor memory comprising:
 a semiconductor substrate;
 a memory cell array comprised of first and second blocks disposed on the semiconductor substrate side by side; and
 a driver disposed between the first and second blocks, wherein each of the first and second blocks is comprised of at least two conductive layers stacked on the semiconductor substrate by being insulated from each other, a bit line disposed on the at least two conductive layers by being insulated therefrom, and a columnar semiconductor having a lower end connected to the semiconductor substrate and an upper end connected to the bit line and passing through the at least two conductive layers, wherein each of the at least two conductive layers is comprised of one of a select gate line and a word line, wherein a select gate transistor is comprised of the select gate line and the columnar semiconductor, and a memory cell is comprised of the word line and the columnar semiconductor, and wherein at least two conductive layers having the same structure as that of the at least two conductive layers in the first and second blocks are disposed on the driver, and the select gate lines in the first and second blocks are connected to the driver through the at least two conductive layers on the driver.

2. The memory according to claim 1, wherein the word lines in the first and second blocks are connected to the driver through the at least two conductive layers on the driver.

3. The memory according to claim 1, wherein the at least two conductive layers on the driver have a plate shape whose width is larger than that of the select gate line.

4. The memory according to claim 1, wherein the lowermost layer of the at least two conductive layers on the driver is a shield line connected to a ground potential.

5. The memory according to claim 1, wherein the select gate line in the first block and the select gate line in the second block are connected to each other, and connected to the driver.

6. The memory according to claim 1, wherein one end of the at least two conductive layers in the first and second blocks is formed stepwise.

7. The memory according to claim 6, wherein one end of each of the at least two conductive layers in the first and second blocks is connected to an interconnect line located above the at least two conductive layers through a contact plug.

8. The memory according to claim 7, wherein the interconnect line is connected to the driver.

9. The memory according to claim 6, wherein one end of each of the at least two conductive layers excluding the uppermost layer is connected to an interconnect line located above the at least two conductive layers through a contact plug.

10. The memory according to claim 9, wherein the interconnect line is connected to the driver.

11. The memory according to claim 9, wherein the other end of the uppermost layer of the at least two conductive layers is connected to an interconnect line located above the at least two conductive layers through a contact plug.

12. The memory according to claim 1, wherein the memory cell and the select gate transistor comprise a NAND cell unit.

13. A three dimensional stacked nonvolatile semiconductor memory comprising:
a semiconductor substrate;
a memory cell array comprised of first and second blocks disposed on the semiconductor substrate side by side in a first direction; and
a driver disposed between the first and second blocks, wherein each of the first and second blocks is comprised of at least three conductive layers stacked on the semiconductor substrate by being insulated from each other, a bit line disposed on the at least three conductive layers by being insulated therefrom, and a columnar semiconductor having a lower end connected to the semiconductor substrate and an upper end connected to the bit line and passing through the at least three conductive layers, wherein an uppermost layer of the at least three conductive layers is comprised of first select gate lines extending in a second direction orthogonal to the first direction, a lowermost layer of the at least three conductive layers is a second select gate line, remaining conductive layers excluding the uppermost layer and the lowermost layer of the at least three conductive layers are a word line, and remaining conductive layers excluding the uppermost layer of the at least three conductive layers have a plate shape whose width in the first direction is larger than the width in the first direction of the first select gate lines, wherein select gate transistors are comprised of the first select gate lines and the columnar semiconductors, and the second select gate line and the columnar semiconductors, respectively and memory cells are comprised of the word line and the columnar semiconductors, respectively, and wherein at least three conductive layers having the same structure as that of the at least three conductive layers in the first and second blocks are disposed on the driver, and first select gate lines in the first and second blocks are connected to the driver through the at least three conductive layers on the driver.

14. The memory according to claim 13, wherein the word lines in the first and second blocks are connected to the driver through the at least three conductive layers on the driver.

15. The memory according to claim 13, wherein the at least three conductive layers on the driver have a plate shape whose width is larger than that of the first select gate lines.

16. The memory according to claim 13, wherein the first select gate lines in the first block and the first select gate lines in the second block are connected to each other, and connected to the driver.

17. The memory according to claim 13, wherein one end of each of the at least three conductive layers in the first and second blocks is connected to an interconnect line located above the at least two conductive layers through a contact plug.

18. The memory according to claim 17, wherein the interconnect line is connected to the driver.

19. The memory according to claim 13, wherein the memory cell and the select gate transistor comprise a NAND cell unit.

20. The memory according to claim 1, wherein the semiconductor substrate has a source diffusion layer, and the columnar semiconductors are connected to the source diffusion layer.

* * * * *